(12) United States Patent
Yasuura et al.

(10) Patent No.: US 6,606,532 B1
(45) Date of Patent: Aug. 12, 2003

(54) METHOD OF MANUFACTURING SYSTEM LSI AND SYSTEM LSI MANUFACTURED USING THE METHOD

(75) Inventors: Hiroto Yasuura, Fukuoka (JP); Akihiko Inoue, Kurume (JP)

(73) Assignee: Semiconductor Technology Academic Research Center, Tokyo (JP)

( * ) Notice: Subject to any disclaimer, the term of this patent is extended or adjusted under 35 U.S.C. 154(b) by 0 days.

(21) Appl. No.: 09/454,561

(22) Filed: Dec. 7, 1999

(30) Foreign Application Priority Data

Jun. 4, 1999 (JP) .......................................... 11-158385

(51) Int. Cl.⁷ .............................................. G06F 19/00
(52) U.S. Cl. ......................... 700/117; 712/200; 716/2; 716/8
(58) Field of Search ............................. 716/1, 2, 8, 17; 700/95, 97, 105, 117, 121; 712/1, 25, 200

(56) References Cited

U.S. PATENT DOCUMENTS

| | | | |
|---|---|---|---|
| 4,949,275 A | * | 8/1990 | Nonaka ........................ 716/12 |
| 5,841,296 A | * | 11/1998 | Churcher et al. ............. 326/44 |
| 5,883,814 A | * | 3/1999 | Luk et al. ...................... 716/2 |
| 6,031,257 A | * | 2/2000 | Noto et al. .................. 257/202 |
| 6,336,207 B2 | * | 1/2002 | Shinomiya et al. ........... 716/11 |
| 6,378,118 B1 | * | 4/2002 | Sugibayashi ................. 716/10 |

OTHER PUBLICATIONS

*Technical Report of IEICE., VLD 98–130, CPSY98–150 (Dec. 1998),* published Dec. 11, 1998 (included in specification) *Disclosure document: invention was disclosed at the 6ᵗʰ Asia Pacific Conference on cHip Design Languages (APCHDL'99),* Oct. 6–8, 1999.

* cited by examiner

*Primary Examiner*—Leo Picard
*Assistant Examiner*—Paul Rodriguez
(74) *Attorney, Agent, or Firm*—Wallenstein & Wagner, Ltd.

(57) ABSTRACT

A method of manufacturing a system LSI is disclosed, in which the running cost such the power consumption is not increased even in the case where the hardware, and software are reused for reducing the manufacturing cost. The method for manufacturing a system LSI, having at least a processor and a memory in a single chip, comprises the steps of preparing a system LSI in the stage where a preset common process has been complete, determining the working area for activating an application program mounted on the system LSI based on the datapath width of the processor and the word length and the number of words of the memory used for activating the application program, and completing the manufacture of the system LSI in such a manner that no power is supplied to the area other than the working area. In this way, the hardware and software are reused without increasing the power consumption or other running costs.

28 Claims, 20 Drawing Sheets

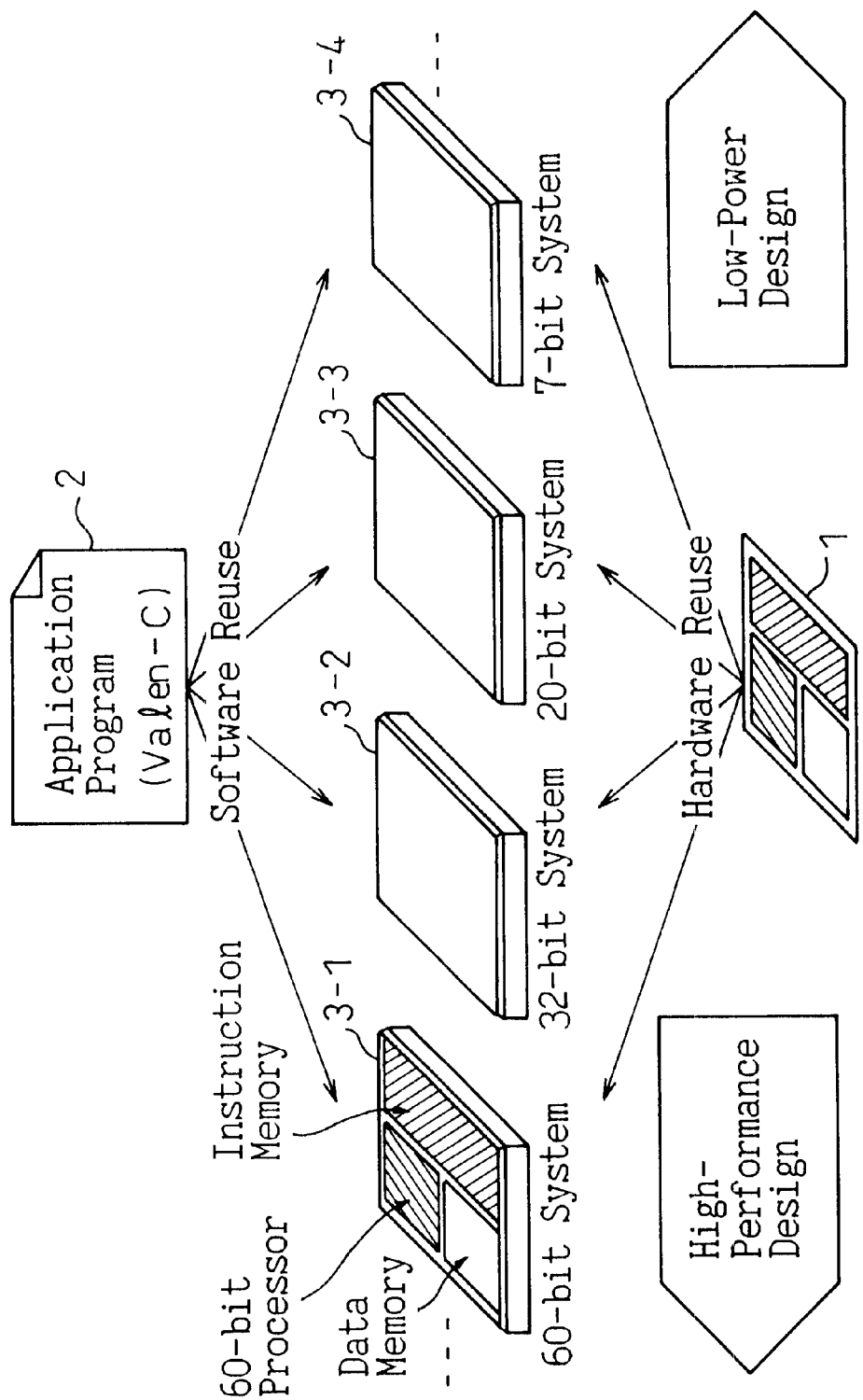

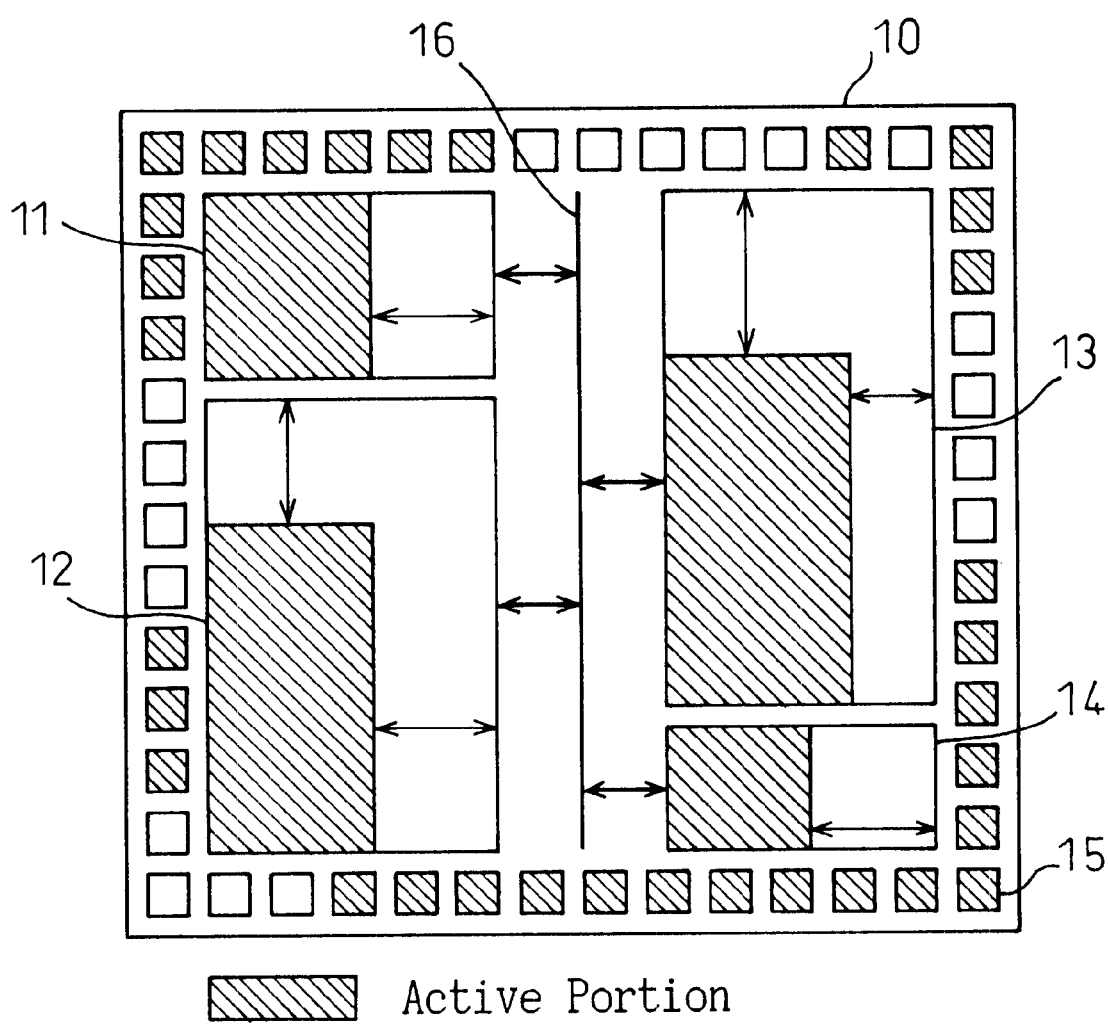

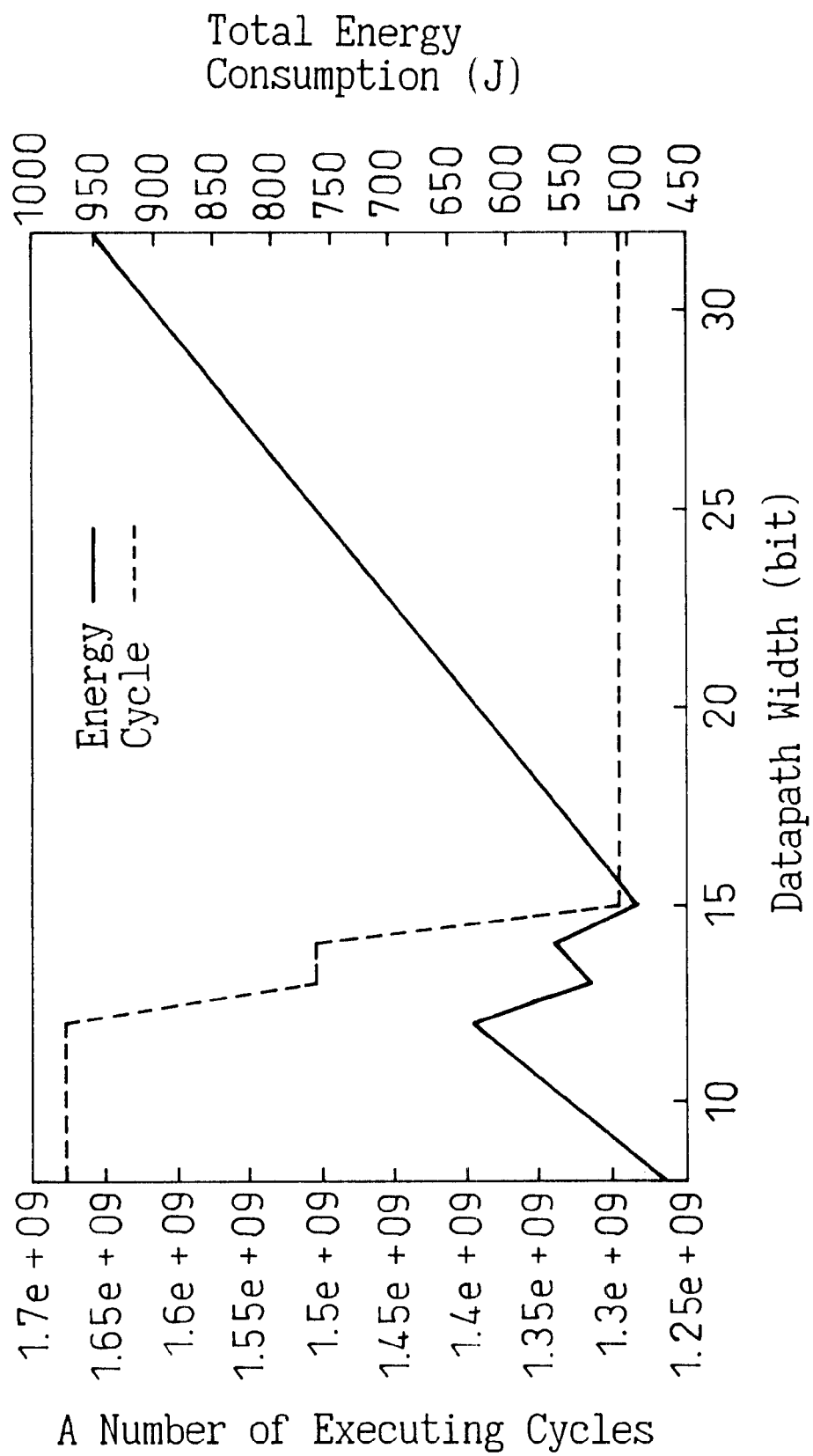

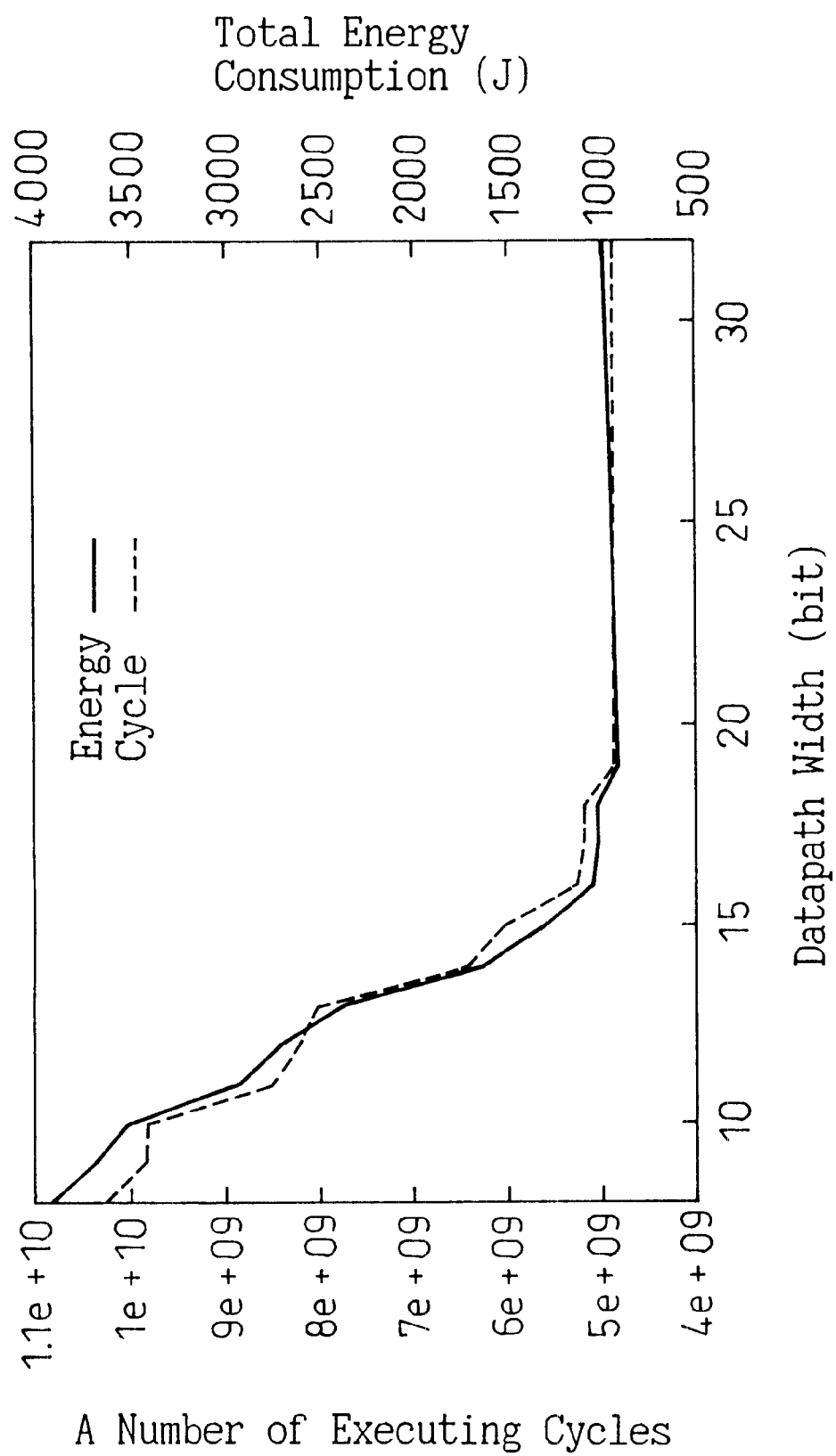

Calculator

Lempel-Ziv

ADPCM

METHOD OF MANUFACTURING SYSTEM LSI AND SYSTEM LSI MANUFACTURED USING THE METHOD

BACKGROUND OF THE INVENTION

The present invention relates to a method of manufacturing a system large-scale integration (LSI) with a core processor, a memory and a peripheral circuit mounted on a single chip and a system LSI manufactured using the particular method, and, in particular, to a method of manufacturing a flexible system LSI chip (FlexSys) which can reduce both the cost and the power consumption, of the system LSI, at the same time.

With the recent progress of micromachining techniques, a system LSI with a system mounted on a single chip has become possible. The system LSI is configured with hardware and software. In the description that follows, it is assumed that the hardware includes a processor, a data memory, an instruction memory and a peripheral circuit, and the software includes an application program.

For reducing the manufacturing cost of the system LSI, reusability must be improved for both hardware and software. The overhead per chip can be reduced by sharing the process of design and manufacture and increasing the substantial production quantity in each process by the reuse of hardware and software.

In designing a embedded system, a processor-based system design is widely employed. This design, including a processor, has two advantages. One is that the specification can be easily changed even in the final stage of the design process. The second advantage is that the design change can be easily accomplished. In the processor-based system design, the reuse of hardware and software greatly contributes to the cost reduction of the system design.

In the processor-based embedded system design, most of the system functions are realized by software. The functions required of the system are becoming more complicated year by year and therefore the software cost increases. Further, with the shortening of the product life and variation of products, an increasingly heavier load is being imposed on software developers. To reduce the software development cost, many software developers convert the functions to parts and reuse the parts. As one example, a program for realizing widely-used functions such as OS and communication control is reused.

For the system LSI with the system functions integrated on a single chip, on the other hand, the design reuse of hardware as well as software is an indispensable technique. The reuse of hardware can reduce the unit cost of the chip. This is by reason of the fact that the reuse makes possible the mass production and reduces the design cost per unit chip and the mask production cost. An example of hardware reuse intended to reduce the chip unit cost by mass production of devices having different purposes is the reuse of base wafers such as gate arrays and FPGAs (field programmable gate arrays). In these approaches, LSIs of a given type having freedom of design at a transistor or gate level are produced in a great quantity, and their purposes are determined in a stage near to the final process thereby to realize a reduced price of the chip. The introduction of this approach to the system LSI with a processor, a memory and an input/output circuit integrated on a single chip is, however, difficult because of the performance and power overhead.

In view of this, the reuse of hardware widely used now for the embedded system is the reuse of the processor and the memory cores.

The embedded software is increasing in size and it is complicated, and it is necessary to improve the reusability in more versatile ways, for all the architectures. Nevertheless, it is considered difficult to reduce both the cost and the power consumption of the system LSI at the same time. The reason is as follows. Now that the restrictions on the heat generation and the battery life are becoming more and more strict, the system LSI is desirably specialized as far as possible for respective applications. The specialization of the system LSI, on the other hand, reduces the possibility of reuse. Further, in view of the trend toward a shorter product life, the production volume of the system LSI is limited. This increases the chip unit cost. A technique is required, therefore, to allow design of the system LSI for general-purpose applications, as far as possible, to permit reuse.

Japanese Unexamined Patent Publication No. 58-186824, for example, proposes a method in which contacts are formed in a required pattern to cut off power supply to those function blocks, integrated on a single semiconductor chip, which are not used for executing the application program. In the actual system LSI, however, there is substantially no block which is not used at all. Namely, a part of every block operates. The proposed method, therefore, fails to exhibit a sufficient effect.

The reuse of the hardware and software of the system LSI will be discussed in more detail. In the following description, the effect that design reuse has on the chip unit cost will be studied using the chip unit cost of LSI as a model.

Let D be the design cost of the LSI, M be the mask production cost, N the number of LSIs with no fault, and F be the production cost per chip (approximated by the chip area). The unit cost P of the LSI is approximated by equation (1).

$$P=(D+M)/N+F \tag{1}$$

Equation (1) shows that with the increase in N, i.e. by manufacturing the same LSI in a large volume, the design cost per chip and the mask production cost are reduced. The micro controller is an example. The micro controller, which is designed as a general-purpose device intended for a plurality of applications, is reusable and the chip thereof is low in cost.

Improving the design reusability makes possible mass production of the chips and can reduce the unit cost thereof. Now, the effect that the design reuse has on the chip unit cost will be analyzed. Assume that a total of N system LSIs are designed for k different applications. The chip unit cost will be compared between two designs (a) and (b). In design (a), one system LSI is commonly used for k applications, while in design (b) k system LSIs are designed. Let P' be the unit cost of the chip designed by the method (a), and Pi be the unit cost of the chip designed by the method (b). Both can be approximated by equations (2) and (3) below.

$$P'=(D'+M')/N+F' \tag{2}$$

$$Pi=(Di+Mi)/ni+Fi \tag{3}$$

The relation between N and ni is expressed by equation (4) below.

$$\sum_{i=0}^{k} ni = N \qquad (4)$$

Assuming that D'≈Di and M'≈Mi, the figure for the case using a single LSI, i.e. the first term of equation (2) above is much smaller. The manufacturing cost F (F', Fi) of the second term, on the other hand, is strongly related to the yield rate determined by the chip area. Generally, the specialization reduces the chip area, and therefore the relation F'>Fi holds. In other words, specialization is recommended for reducing the second term.

As one of the methods for solving the above-mentioned problems, a technique of limiting the range of reuse and using a single LSI for a plurality of applications, i.e. a technique of designing one type of LSI for k (k>1) applications is widely used. A small-scale system built into domestic electric appliances and mainly in charge of the control operation thereof, for example, uses a small-scale LSI such as a 4-bit microcomputer, while a portable information terminal involving sophisticated signal processing therein uses a large LSI such as a 32-bit microcomputer.

The current general-purpose microcomputers, however, have the power consumption and the basic performance thereof fixed by the chip and are not easily used for different applications in a versatile way without packaging more than the required circuits or the wasteful use of the silicon area. The range of reuse is limited, and therefore a 4-bit system is not realized in a 32-bit microcomputer, for example. Nevertheless, the problem is posed that unrequired power consumption occurs in each range. In the case where a 32-bit microcomputer is used for applications to process not more than 24-bit data, for example, the memory mounted in the microcomputer has an area beyond the variables requiring only the accuracy of 24 bits and therefore includes an area completely unused. In such a case, not a small amount of power is consumed by the unrequired upper bits of datapath.

As described above, reusing a system LSI for various applications as far as possible, though one method of reducing the chip unit cost, is accompanied by the problem of an increased unrequired power consumption. The unrequited power consumption is derived from the unrequired switching operation of parts of the function unit, register and bus of the processor. In the case where 8-bit coded characters are processed on a 32-bit processor, for example, the most significant 24 bits in the data bus and the processor have no meaning. A switching operation in this unused area leads to the waste of power.

In similar fashion, unrequired power may be consumed by the memory. In the case where the processor reads a variable x having the size of 32 bits from memory, for example, the precharge circuit of the memory, the sense amplifier circuit, the bit line and the word line are driven to consume power. When the maximum value of the variable x is 1 and the minimum value thereof is 0 for all input data (in the case where x is used as a flag, for example), the power consumed for reading the data of the most significant 31 bits from the memory is wasteful. It is also clear from the foregoing description that the unrequired power consumption may be caused by the bus between the memory and the processor.

In a large-scale circuit such as the system LSI, the unrequited parts of the circuit have a large effect on the chip unit cost. The power consumed by the unrequited parts of the circuit and the unrequited external pins increases the package cost. Further, the energy (hereinafter called the running cost) consumed in the LSI during the operation unnecessarily shortens the battery life. Equation (1) takes only the chip manufacturing cost into account. This cost, however, fails to cover the entire actual cost and is required to include the running cost. Let E be the total of the package cost and the running cost. The chip unit cost is redefined as equation (5).

$$P=(D+M)/N+F+E \qquad (5)$$

An architecture of the system LSI is crucial for minimizing E and maximizing the reduction of the first term due to the mass production. For the conventional system LSI, however, there has been no manufacturing method conceived and realized from such a point of view.

SUMMARY OF THE INVENTION

The object of the present invention is to realize a method of manufacturing a system LSI which is not accompanied by an increased power consumption or increased running cost even in the case of reuse hardware and software for reducing the manufacturing cost.

In order to achieve the above-mentioned object, according to the present invention, there is provided a method of manufacturing a system LSI comprising the steps of determining the working area required of the memory and the processor from the datapath width required for activating an application program thereby to prevent power from being supplied to the unused area, thereby reusing and commonly using the hardware and software without increasing the running cost such as the power consumption.

Specifically, according to the invention, there is provided a method of manufacturing a system LSI having at least a processor and a memory in a single chip, comprising the steps of preparing a system LSI in the stage where a preset common process has been completed, determining the working area for activation of an application program mounted on the system LSI based on the datapath width of the processor and the datapath width and the number of words of the memory used upon activation of the application program, and completing the manufacture of the system LSI in such a manner as not to supply power to areas other than the working area.

FIGS. 1A and 2B are diagrams showing the difference between the conventional method of manufacturing the microcomputer and a method according to the invention. FIG. 1A shows the prior art, and FIG. 1B shows the invention.

As described above, in the conventional method of manufacturing the system LSI, the hardware is not customized but the range of reuse of the hardware is selectable while the software is customized. According to the method of manufacturing the system LSI of the present invention, in contrast, both the software and the hardware are customized, and the software design parameters are reflected in the hardware manufacturing process so that the LSI design data and mask data are reused. According to this invention, the unrequired power consumption of the system LSI is suppressed by several masks in the final design step to reduce the cost. The datapath width and the number of words in the memory are optimized in accordance with each application, and power is supplied only to the required parts to minimize the power consumption.

FIG. 2 is a diagram showing a general configuration for a method of manufacturing the system LSI according to this invention.

The LSI manufactured by this method is a system LSI with a core processor, a data memory, an instruction memory and peripheral circuits integrated in a single chip. In the method of manufacturing this system LSI, a general-purpose LSI chip 1 provides a base, and in accordance with the application program 2, the datapath width can be changed to an arbitrary length not more than the upper-limit datapath width of the general-purpose LSI chip 1. In addition, the datapath width of the core processor, the data memory and the instruction memory (also the peripheral circuit as required) is shortened so that power is not supplied to the areas not used, nor to the areas of the data memory and the instruction memory (and peripheral circuits as required) not used for execution of the application program 2, thus saving the unrequired power consumption.

Assume, for example, that the datapath width of the general-purpose LSI chip 1 is 64 bits and both the data memory and the instruction memory have a sufficient capacity. In designing a high-performance system LSI, a LSI 3-1 with the datapath width of 60 bits is employed, while in designing the system LSI of low power consumption, a LSI 3-4 with the datapath width of 7 bits is employed, while a 32-bit LSI 3-2 or a 20-bit LSI 3-3 is employed for the intermediate system. In this way, an LSI of an arbitrary datapath width can be employed. In other words, system LSIs having various datapath width can be designed from one general-purpose LSI. In addition, since a general-purpose LSI chip providing the base is customized in a stage near to the final step, the value N in the first term of equation (5) can become very large.

B. Shackleford, et al. report in "Embedded System Cost Optimization via Data path Width Adjustment", IEICE Trans. Information and systems, Vol. E80-D, No. 10. pp. 974–981, October 1997, that the datapath width has a strong effect on the area and performance of the system. In "A Programming Language for Processor-Based Embedded Systems" in Proc. of Fifth Asian Pacific Conf. on Hardware Description Languages, pp. 89–94, 1998, on the other hand, A. Inoue et al. report that the datapath width has a strong effect also on the power consumption.

By shortening the datapath width and thus saving the power supply to the areas not used, a LSI can be produced having the same power consumption as the LSI designed with the particular shortened datapath width. In the case where a general-purpose LSI chip having a 64-bit processor mounted thereon is designed and power supply to the most significant 16 bits is cut off in the manufacturing process, for example, it is possible to produce a system LSI operating in a similar manner to the system LSI having a 48-bit processor mounted thereon. In this way, the present invention can minimize the running cost.

Further, the package cost can also be minimized by disconnecting the electrode pads of the unused areas with external pins when packaging the system LSI. As described above, the method of manufacturing the system LSI according to this invention is expected to reduce both the first and third terms of equation (5).

An application program is described in a software language by which the system designer can set the variable length arbitrarily.

In the step of determining the working area, an application program is compiled using a compiler corresponding to the datapath width set by the system designer, and the program thus compiled is used for simulation.

As described above, the method of manufacturing the system LSI according to the invention can change the power consumption according to applications, and therefore one general-purpose LSI chip is applicable to broad fields (various application programs). As a result, one type of LSI can be mass produced, and the resulting increased production volume (with an increased N in equation (5)) can reduce the chip unit cost.

Also, the driving conditions of the processor, the data bus, the register and the bus can be designated in bits. By appropriately selecting the datapath width of the processor according to applications, therefore, the unrequired power consumption can be eliminated. The memory can be similarly reduced in power consumption, thereby leading to a lower package cost.

Further, the system LSI according to the invention, unlike the conventional LSI constituting a part, is a system itself. At the time of system design, therefore, the LSI is specialized simply by the development of software and customization in the last step of manufacture. The step of collecting the component parts of the system and integrating them inone chip is eliminated, and therefore the intended LSI can be designed in a short time.

Furthermore, in view of the fact that the system LSI is customized immediately before packaging, the unrequired pins are not included in the packaging process, thereby reducing the packaging cost.

In addition, the reuse of the LSI itself permits a high-accuracy estimation. Since the physical information of the LSI such as the wiring resistance is fixed, the estimation accuracy of the power consumption in the early design steps is improved. The high-accuracy estimation technique is crucial for determining the design parameters of the system LSI.

BRIEF DESCRIPTION OF THE DRAWINGS

The feature and advantages of the system LSI according to the present invention will be more clearly understood from the following description taken in conjunction with the accompanying drawings, in which:

FIG. 2 is a model diagram showing the general configuration for the methods of manufacturing the system LSI according to the prior art and the present invention;

FIG. 3 is a diagram showing a configuration of the LSI chip according to an embodiment of the invention;

FIG. 19 is a diagram showing the result of an experiment conducted on an application program using Lempel-Ziv algorithm according to the invention;

FIG. 20 is a diagram showing the result of an experiment conducted on an application of ADPCM according to the invention.

DESCRIPTION OF THE PREFERRED EMBODIMENTS

Figure 1A:
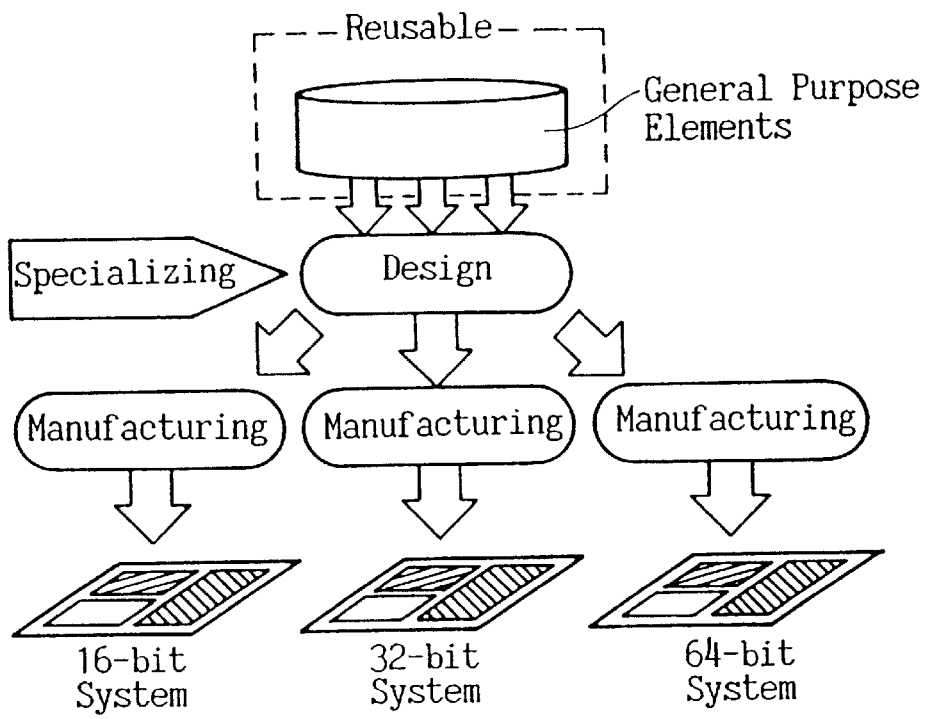
FIGS. 1A and 1B are diagrams showing the difference between the conventional method of manufacturing a microcomputer and the manufacturing method according to the invention.
Figure 1B:
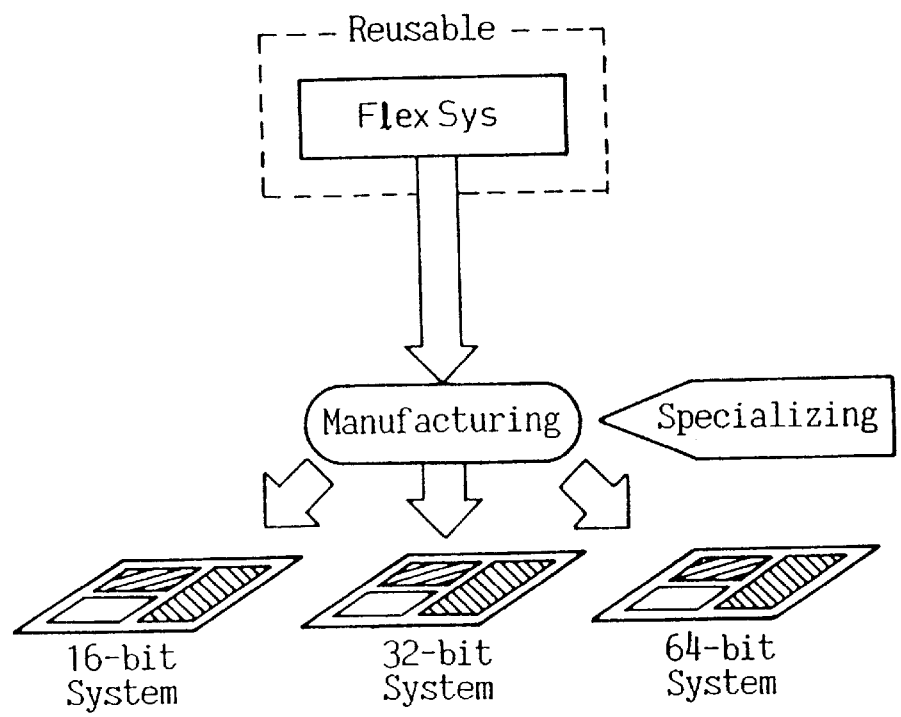

An embodiment of the invention will be explained below. In an embodiment of the invention, a general-purpose LSI chip is prepared as shown in FIG. 2.

FIG. 3 is a diagram showing a configuration of a general-purpose LSI chip according to an embodiment. As shown in FIG. 3, this general-purpose LSI chip 10 includes a core processor 11, a data memory 12, an instruction memory 13 and a peripheral circuit 14. These component elements are connected to each other by a system bus 16. Reference numeral 15 designates electrode pads. In FIG. 3, the hatched portions designate areas operated while a given application is being executed. The hatched portions of the electrode pads are the ones connected to external pins at the time of packaging. The system designer can freely change the hatched portions of FIG. 3, i.e. the areas supplied with power, in the last step of manufacture.

Power supplied to each part can be cut off by various methods well known to those skilled in the art. A case in which power is cut off to the core processor 11 and the data memory 12 will be briefly explained below.

Figure 4:
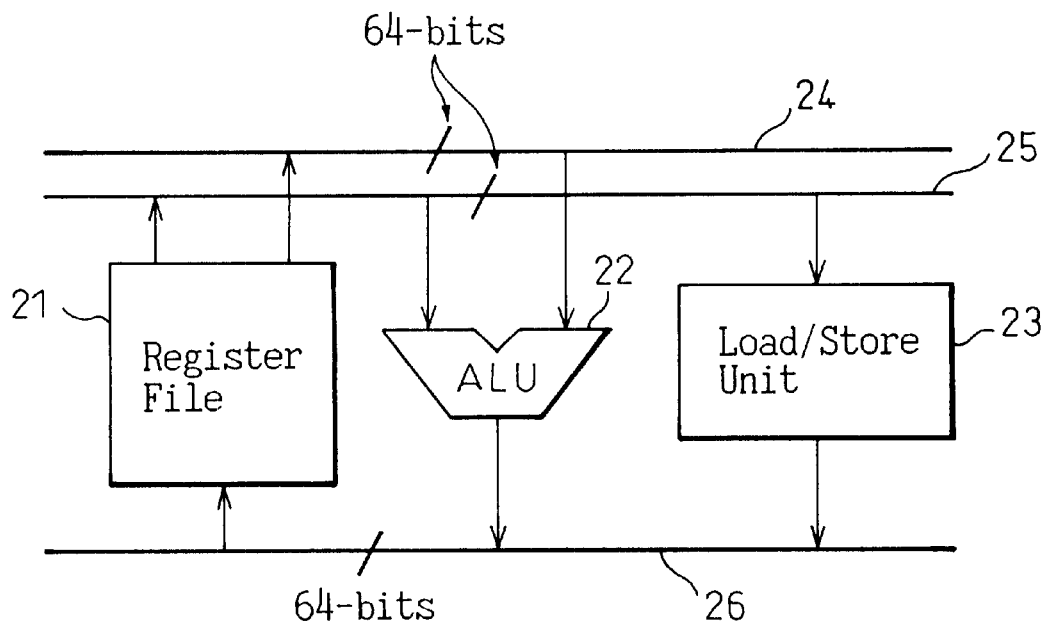
FIG. 4 is a diagram showing a configuration of the core processor of the LSI according to an embodiment.

FIG. 4 is a diagram showing a configuration of the core processor 11 according to an embodiment. The core processor is a RISC processor often used with an embedded system, for example, and in the case under consideration, a processor having a 64-bit datapath width. As shown in FIG. 4, the core processor 11 includes a register file 21, an ALU (arithmetic unit) 22 and a load/store unit 23 connected to each other through data buses 24 to 26. Each data bus has a data width of 64 bits.

The signal of the most significant 53 bits of the data buses 24 to 26 comes to lose the transition ability by invalidating the power supply to the most significant 53 bits of all the registers existing in the register file 21. As a result, the power consumption by the signal transition of the most significant 53 bits of the ALU 22 and the load/store unit 23 is saved. In this case, the core processor 11 apparently becomes an 11-bit processor.

Figure 6:
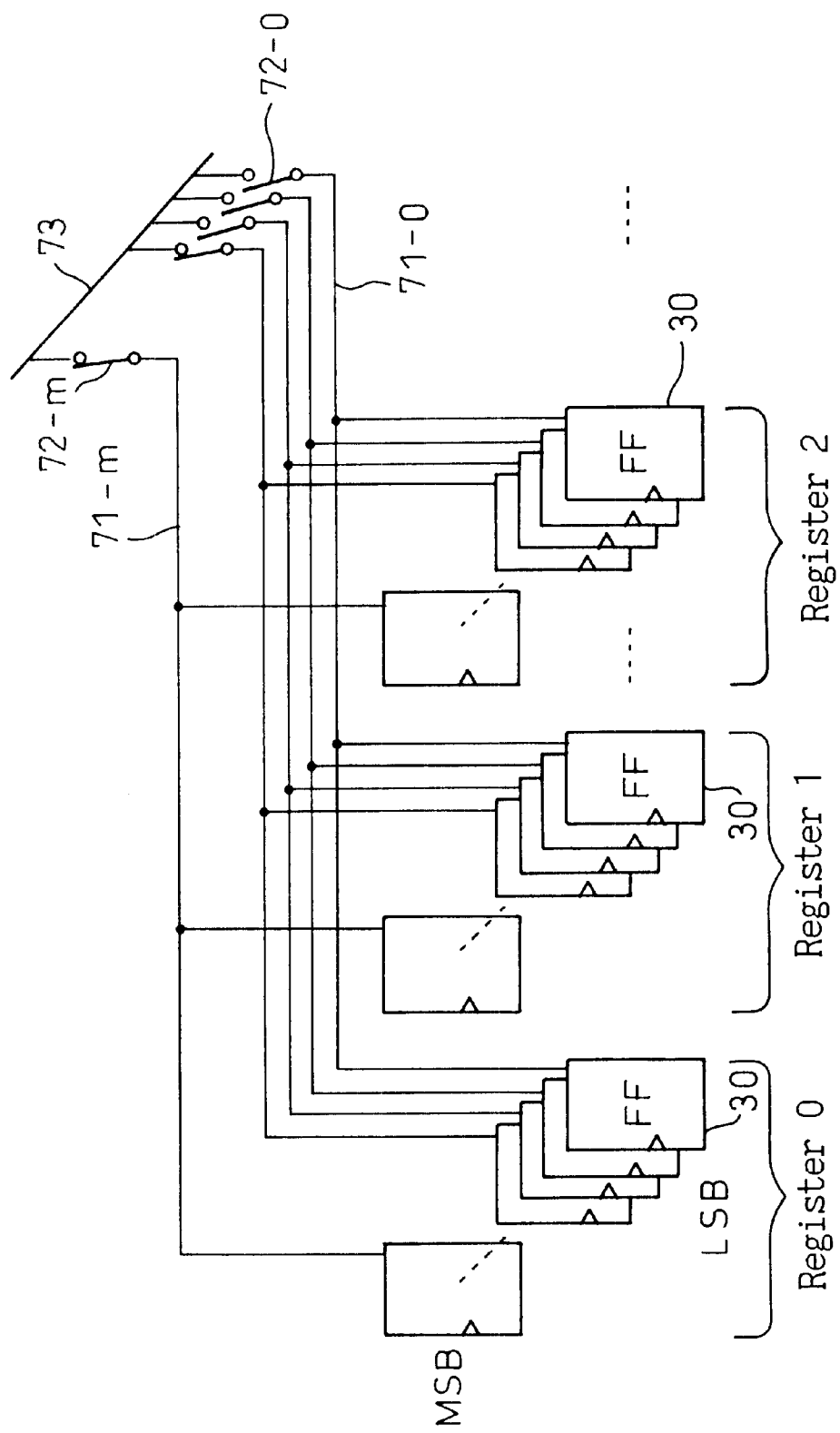
FIG. 6 is a diagram showing another configuration for cutting off power supply to the register file of the core processor.

The processor and memory of the system LSI can be segmented into a plurality of large areas, i.e., group of flip-flops. Each large area includes an upper power wiring layer adapted to be set for supplying power to each of the large areas and a lower power wiring layer adapted to be set for supplying power to one or more smaller areas, i.e., single flip-flop, within each of the large areas. As shown in FIG. 6, the wiring of the upper power wiring layer to the large areas is cut-off when all of the large areas are included in the unused area. The wiring of the upper power wiring layer to the large areas is not cut-off and the lower power wiring layer in the large areas is partially cut-off in the case when part of the large areas are included in the unused area.

Figure 5:
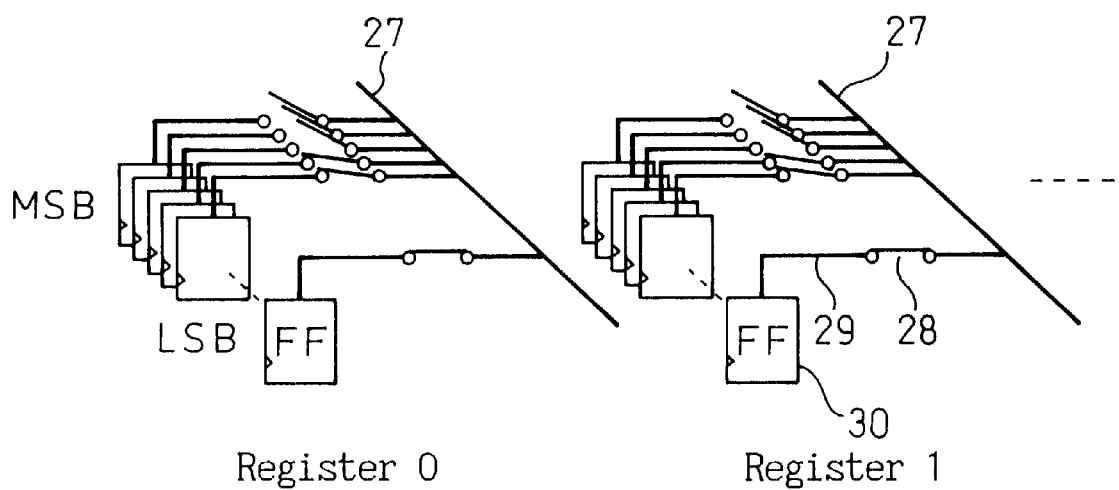
FIG. 5 is a diagram showing a configuration for cutting off power supply to the register file of the core processor.

An example of cutting off power to the register file 21 is shown in FIG. 5. In this example, power supply to the most significant three bits of all the registers of the register file 21 is cut off. A flip-flop (FF) 30 is provided for each bit of each register, and a switch unit 28 is inserted between the power wiring 29 of each FF 30 and the power line 27. By turning off the switch unit 28, the power supply to the corresponding FF 30 can be cut off. As a result, the FF 30 of each register can be independently set in power supply mode or in power cut off mode. For example, the power wiring 29 is formed as a lower layer and the power line 27 as an upper layer.

FIG. 6 shows another example of cutting off the power supply to the register file 21. In the example of FIG. 5, the power supply to the most significant bits is cut off. In the case shown in FIG. 6, in contrast, the power supply to the least significant bits is cut off. Also, in the example of FIG. 6, the FFs 30 corresponding to the same bit position of the registers are connected to common power wiring 71-0 to 71-m, and switch units 72-0 to 71-m are inserted between the power wiring the the power line 73. By turning off the switch units 72-0 to 72-m, the power supply to the FFs 30 corresponding to all the registers can be cut off. Specifically, in the case of FIG. 5, the FF 30 of each register can be independently set in power supply mode or power cut off mode. In the case of FIG. 6, in contrast, the FFs 30 corresponding to all the registers are set collectively in power supply mode or power cut off mode. Further, the power wiring 71-0 to 71-m are formed as a lower layer, and the power line 72 as an upper layer.

Now, an explanation will be given of a configuration for realizing the switch units 28 of FIG. 5 and the switch units 72-0 to 72-m of FIG. 6. The switch units are realized by changing the mask pattern or by radiating a laser and cutting off the pattern.

Figure 7A:
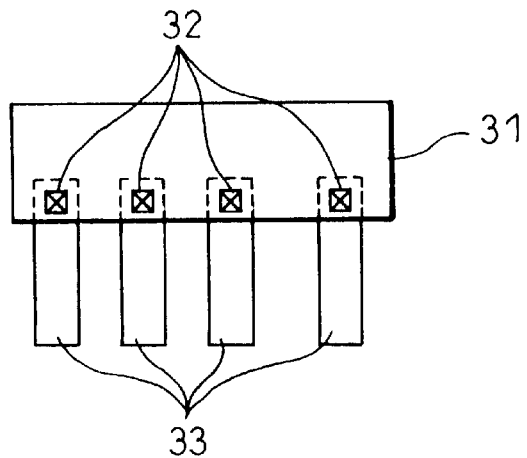
FIGS. 7A to 7C are diagrams showing an example of cutting off power supply.
Figure 7B:
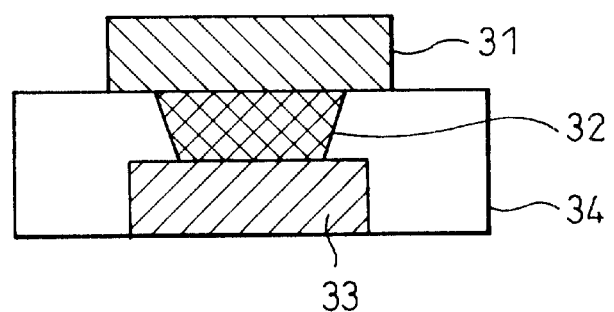
Figure 7C:
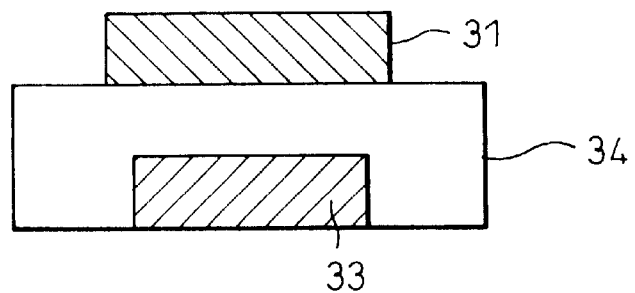

FIGS. 7A to 7C shows a case in which the switch units are realized by changing the mask pattern of via holes (contact holes) of the upper and lower layers. FIG. 7A is a top plan view of the case in which the wiring 31 of the upper layer and the wiring 33 of the lower layer are connected by via holes, and FIG. 7B is a sectional view showing a via hole portion. The upper layer wiring 31 corresponds to the power lines 27, 73 and the lower wiring 33 corresponds to the power wiring 29, 71-0 to 71-m, for example. After forming the lower layer wiring 33, an insulating layer 34 is formed to cover the wiring 33. The portions of the insulating layer 34 corresponding to the via holes 32 are formed with holes by etching, and a conductive layer is formed in each of the holes as a via hole, on which the upper layer wiring 31 is formed. All of these portions are shaped by exposing a pattern. When forming holes by exposing a via hole pattern, the via holes cannot be formed unless holes are formed in the portions of the via holes connected to the lower layer wiring 33 for cutting off the power supply. FIG. 7C is a sectional view showing the contact portion not formed with Via holes.

In this way, the power supply mode or power cut off mode can be set easily simply by changing the exposure pattern of via holes.

In the example mentioned above, the switch units are realized by changing the mask pattern of the via holes connecting the upper layer wiring and the lower layer wiring. The switch units, however, can alternatively be realized by changing the wiring pattern of the upper layer or the lower layer.

Figure 8A:
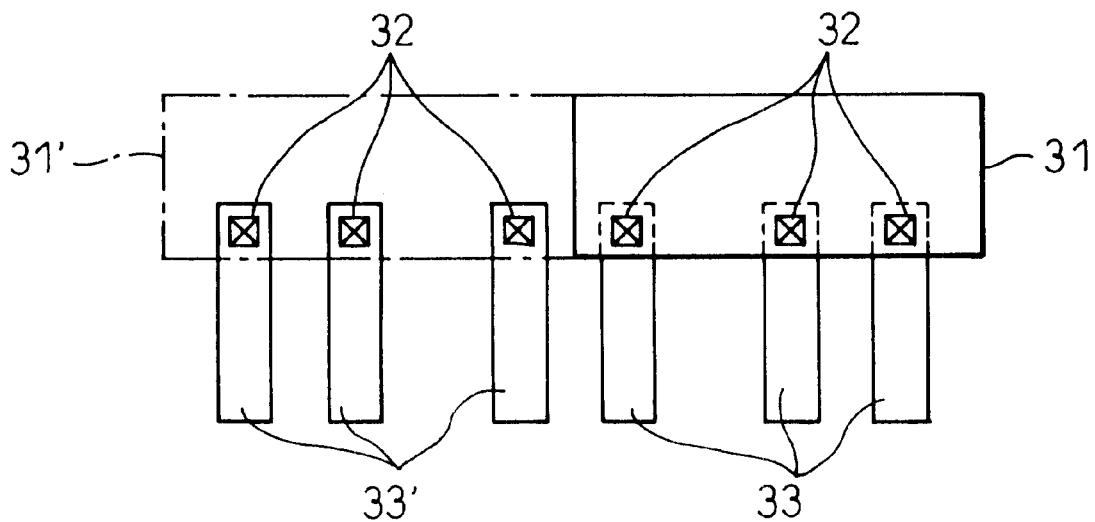
FIGS. 8A and 8B are diagrams showing another example of cutting off power supply.
Figure 8B:
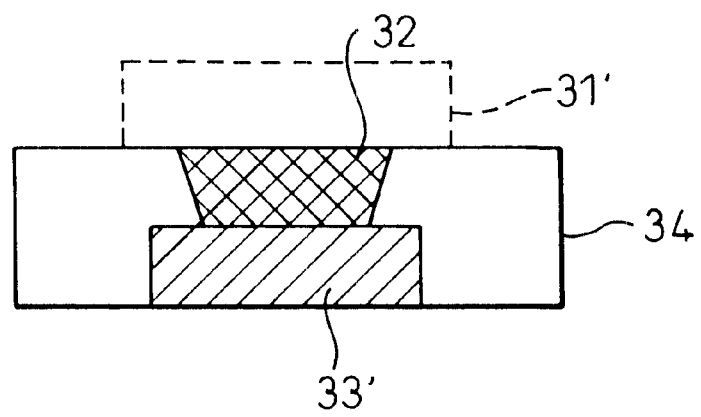

FIGS. 8A and 8B show an example for realizing the switch units by changing the upper layer wiring pattern. FIG. 8A is a top plan view, and FIG. 8B a sectional view. As shown in the diagrams, the pattern of a portion 31' of the upper layer wiring 31 is removed and the power is not supplied to the lower layer wiring 33'. As a result, the power supply to the FFs 30 of the register file 21 corresponding to the most significant or least significant bits to be turned off can be easily cut off.

Figure 9A:
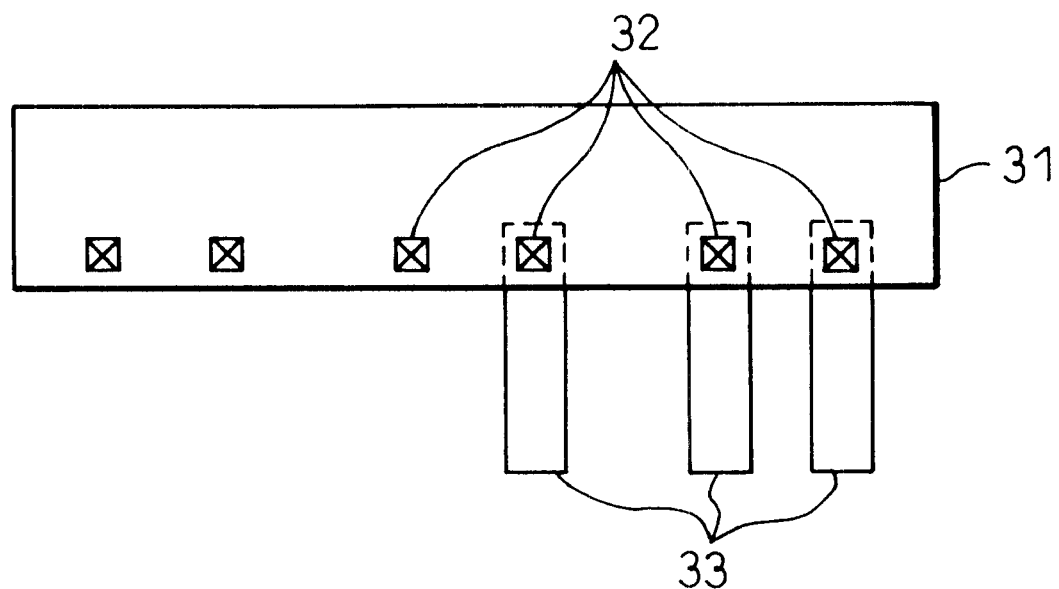
FIGS. 9A and 9B are diagrams showing still another example of cutting off power supply.
Figure 9B:
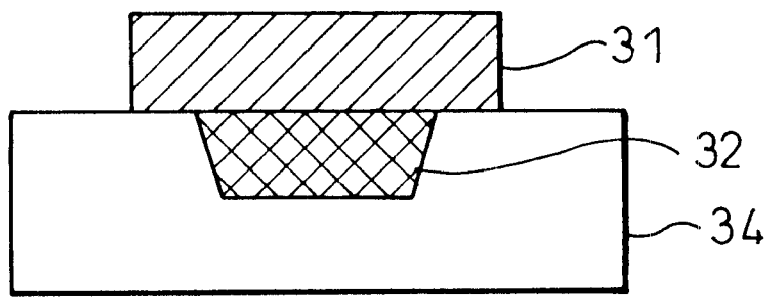

FIGS. 9A and 9B. show an example for realizing the switch units by changing the lower layer wiring pattern. FIG. 9A is a top plan view, and FIG. 9B a sectional view. As shown in the diagrams, the lower layer wiring pattern connected to the FFs 30 to which power supply is cut off is removed.

Figure 10A:
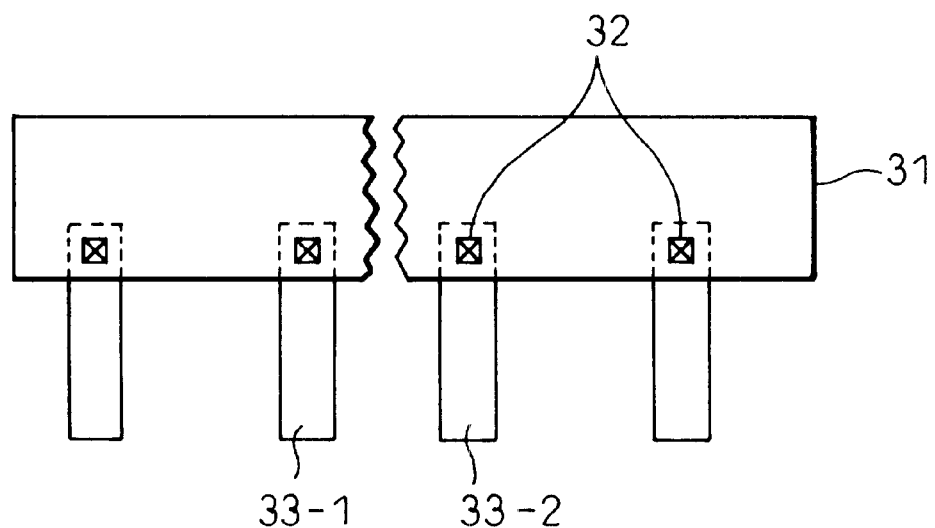
FIGS. 10A and 10B are diagrams showing yet another example of cutting off power supply.
Figure 10B:
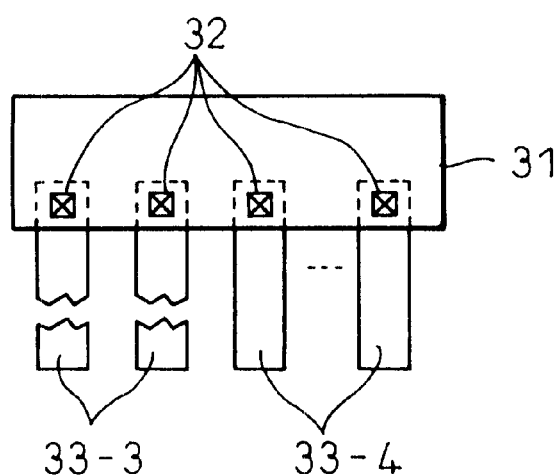

FIGS. 10A and 10B show an example of realizing a switch unit by cutting off a wiring pattern by laser radiation. FIG. 10A shows the case in which the upper layer is cut off, and FIG. 10B the case in which the lower layer is cut off. As shown in FIG. 10A, cutting the upper layer wiring 31 midway prevents power passing. Although the lower layer wiring 33-2 is supplied with power, the lower layer wiring 33-1 is not. Also, as shown in FIG. 10B, by cutting the lower layer wiring 33-3 midway, the power supply is cut. The portions connected with the lower layer wiring 33-4 not cut off are supplied with power.

Figure 11:
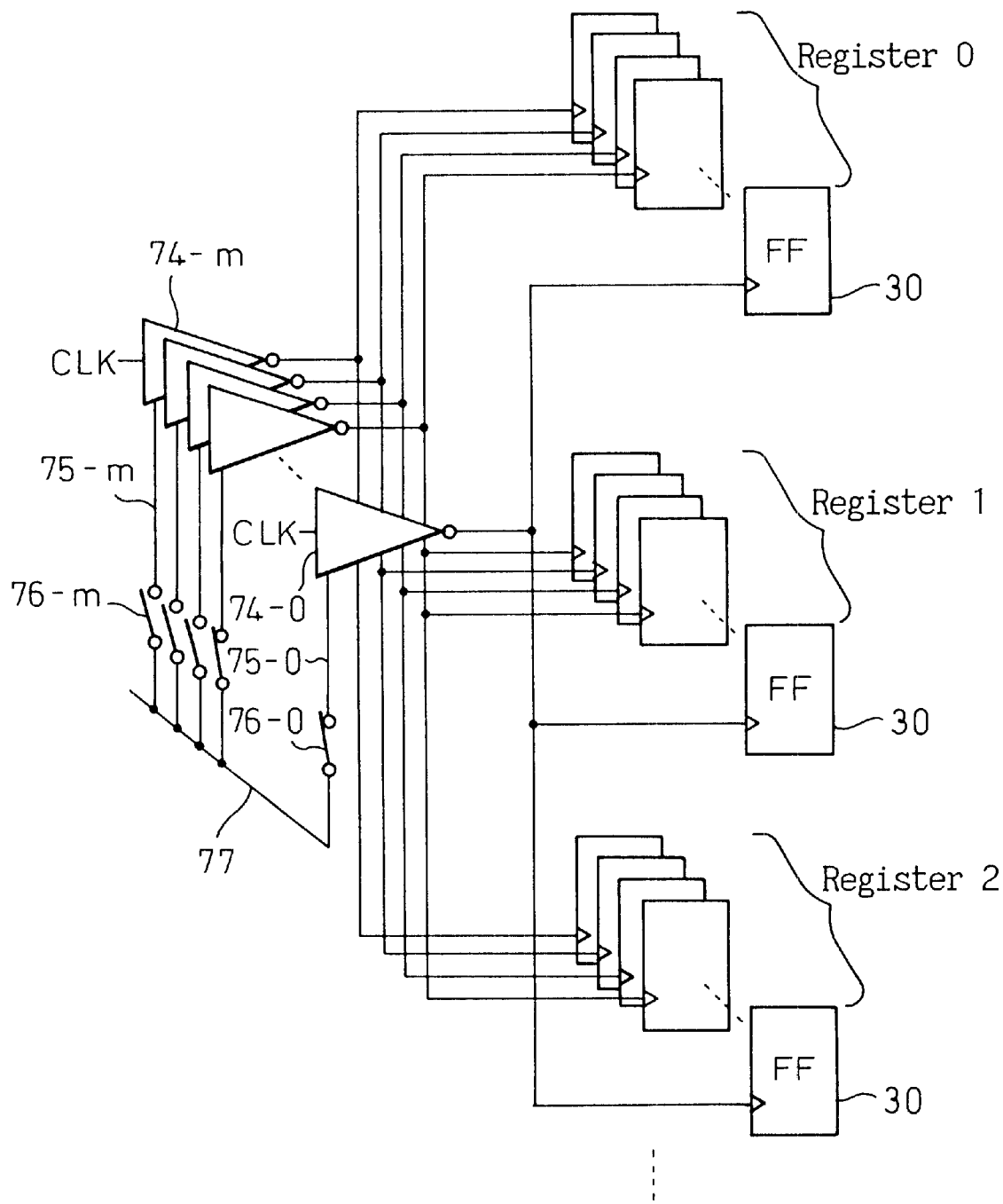
FIG. 11 is a diagram showing a configuration for cutting off the clock supply to the register file of the core processor.

The foregoing description represents the case in which power supply to the register file 21 is cut off. As an alternative, the clock signal supplied to each FF 30 of the register file 21 can be cut off to reduce the power consumption in similar fashion. FIG. 11 is an example configuration for cutting off the clock signal supplied to each FF 30 of the register file 21. As shown, the clock signal input to the FF 30 of each register is supplied from one of the clock buffers 74-0 to 74-m collectively in bits. The power wiring 75-0 to 75-m of the clock buffers 74-0 to 74-m are connected to the power line 77 through the switch units 76-0 to 76-m. By cutting off a part of the switch units, a corresponding switch unit is deactivated, so that the clock signal is not input to the FFs of corresponding bits of all the register. In response, the transition by the clock signal fails to occur, nor does the signal transition of the data bus occur. Thus the power consumption in the deactivated parts is reduced.

As shown in FIGS. 5 and 11, in the case where the portions of the processor associated with the most significant bits are deactivated, a carry of the most significant bits not deactivated must be output. Therefore, the ALU (arithmetic unit) requires a mechanism for detecting and outputting a carry generated with arbitrary bits.

Figure 12:
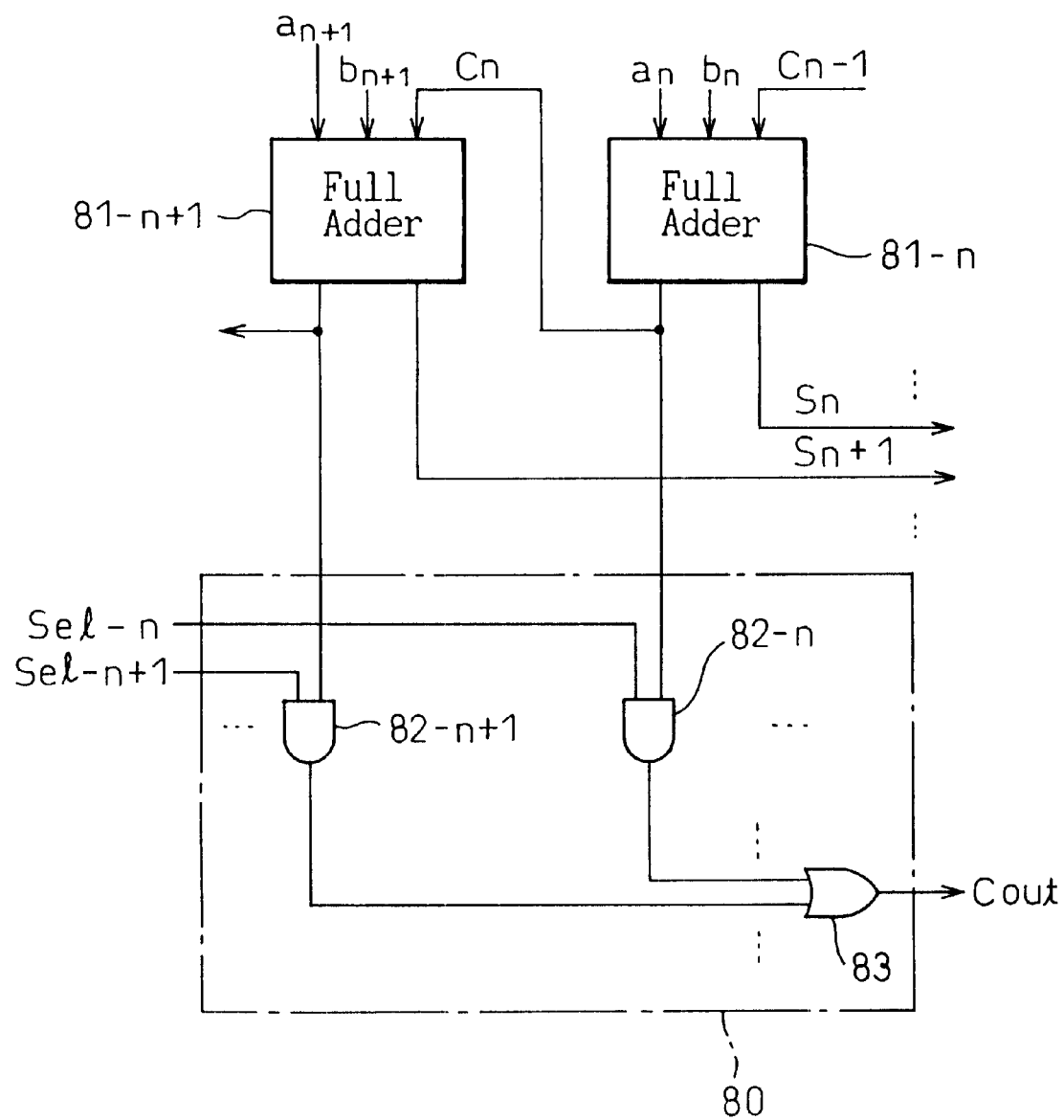
FIG. 12 is a diagram showing a configuration of an arithmetic unit for deactivating the most significant bits of the core processor.

FIG. 12 is a diagram showing a configuration of the ALU for deactivating the portions associated with the most significant bits between the nth bit and (n+1)th bit. As shown in FIG. 12, the nth bit portion includes an adder 81-n for adding the bit input $a_n$ corresponding to one of the register, the bit input $b_n$ corresponding to the other register and the carry Cn−1 of the bits in the preceding stage. The adder 81-n outputs the result Sn of the arithmetic operation and the carry Cn. This is the same as in the prior art. According to this embodiment, however, a selector 80 is provided for selecting and outputting any one of the carries Cn of each bit. The selector 80 includes an AND gate 82-n for calculating the logic product of the carry Cn of each bit and the select signal Seln, and an OR gate 83 for calculating the logic product of the outputs of the AND gates of the respective bits. Which one of the select signals Seln is to be raised to "High" is set at the time of manufacture.

As shown in FIG. 6, in the case where the operation of the portions of the processor associated with the least significant bits are deactivated, it is necessary to input a carry from outside to the least significant bits not deactivated. For this purpose, the ALU requires a mechanism for producing a carry input by selecting an outside carry and a carry output from the least significant bits at an arbitrary bit position.

Figure 13:
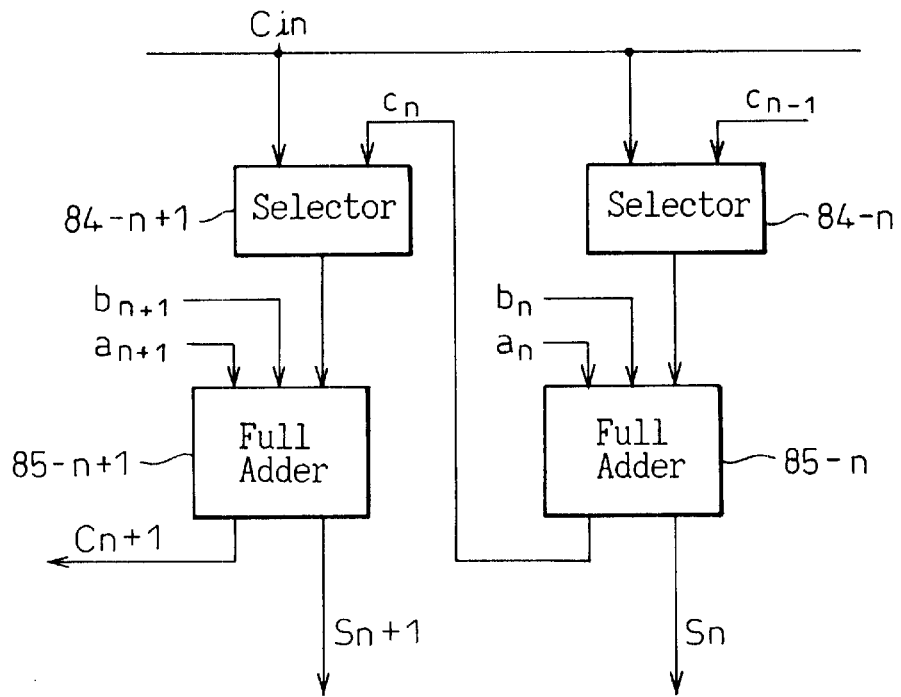
FIG. 13 is a diagram showing a configuration of an arithmetic unit for deactivating the least significant bits of the core processor.

FIG. 13 is a diagram showing a configuration of the ALU in the case where the portions associated with the least significant bits are deactivated. The portion between the nth bit and the (n+1)th bit is shown. This ALU, as in the prior art, includes at the nth bit position thereof an adder 85-n for adding the bit input $a_n$ corresponding to one of the registers, the bit input $b_n$ corresponding to the other register and a bit carry from the preceding stage. There is also provided a selector 84-n for selecting the carry Cn−1 or the carry Cin input from outside. The output of the selector 84-n is input to the carry of the adder 85-n. The conditions for selection of each bit by the selector are set at the time of manufacture.

Figure 14:
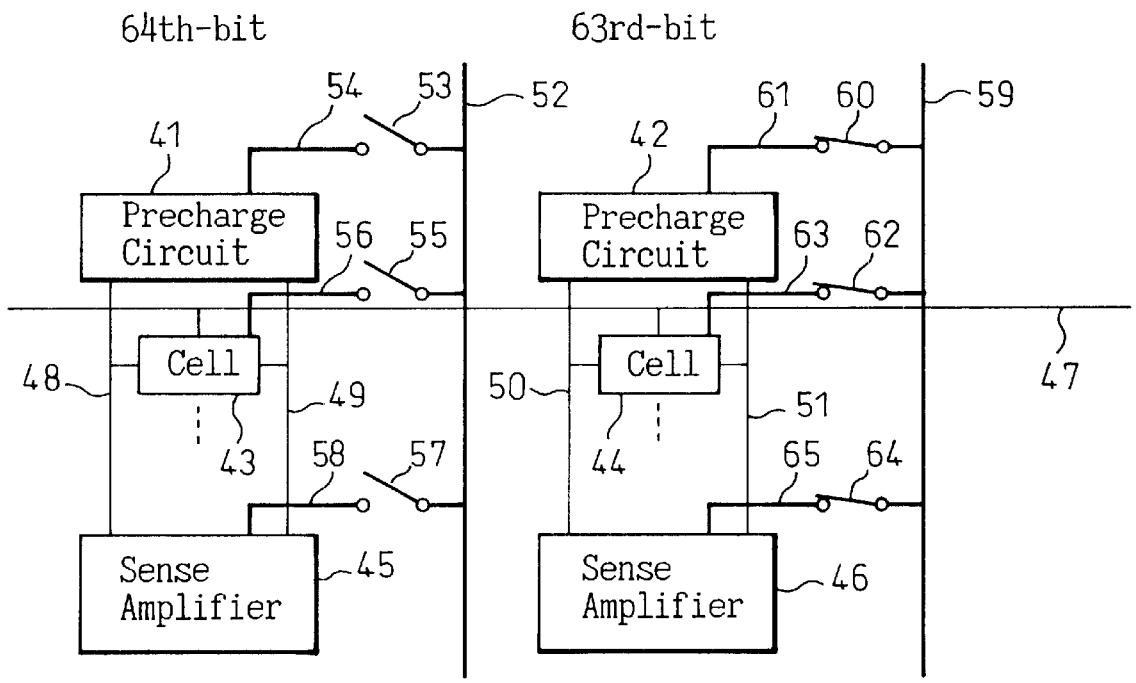
FIG. 14 is a diagram showing a configuration of a data memory and a configuration for cutting off power supply to the data memory.

The data memory 12 can be a SRAM, a DRAM or FeRAM. In the case under consideration, the data memory 12 is configured with a SRAM. FIG. 14 is a diagram showing a configuration of the SRAM forming the data memory 12 according to this embodiment. The power wiring 54, 61 of precharge circuits 41, 42 are connected to the power lines 52, 59 through the switch units 53, 60, respectively. The power wiring 56, 63 of the memory cells 43, 44, on the other hand, are connected to the power lines 52, 59 through the switch units 55, 62, respectively. Also, the power wiring 58, 65 of the sense amplifiers 45, 46 are connected to the power lines 52, 59 through the switch units 57, 64, respectively. In the same manner as described with reference to the power wiring of the register file, power is not supplied to the unrequired areas. In similar fashion, the gate for driving the word line 47 is not supplied with power.

Also, a mask ROM or a flash memory can be used as the instruction memory 13. In this case, too, like the SRAM, only the working area can be supplied with power.

Figure 15:
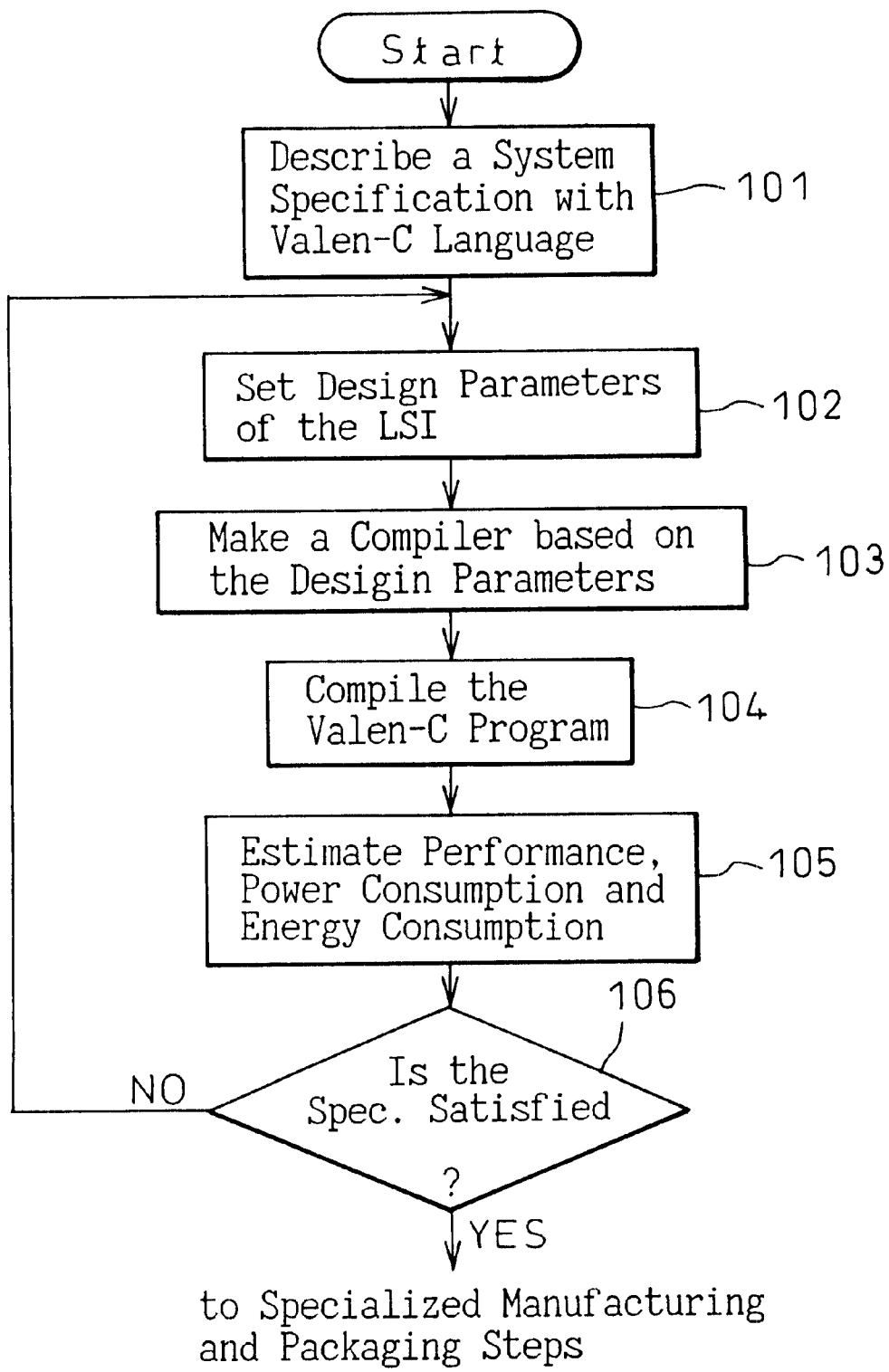
FIG. 15 is a flowchart showing the design process according to an embodiment.

FIG. 15 is a flowchart showing the design process of the system LSI according to an embodiment of the invention.

As shown in FIG. 15, the system LSI according to this embodiment is designed following the process including the step 101 for producing a program described in a Valen-C or the like program language enabling the system specification designer to set variable length, the step 102 for setting the design parameter of the LSI providing the design specification, the step 103 for generating a compiler based on the design parameter, the step 104 for compiling the program described in Valen-C produced in step 101, the step 105 for estimating the performance, power consumption and the energy consumption by simulating a compiled program, and the step 106 for determining whether the estimated result satisfies the specification or not. In the case where the specification fails to be satisfied, the process returns to step 102 where the design parameter is changed and the process is repeated from steps 102 to 106. In the case where the specification is satisfied, on the other hand, the customization and packaging process for manufacture is carried out in accordance with the particular design parameter.

The design process will be described in more detail. In the manufacture of the system LSI, the reuse of software is crucial. In the manufacturing method according to the invention, however, the simple change of the datapath width may deteriorate the reusability of the software. This is by reason of the fact that when changing the datapath width of the processor, the program described for the processor before change may not operate normally with the processor after change. The data type is of the C program, for example, depends on the datapath width of the processor. In many cases, the size of integer (int) type is 32 bits when compiled on the 32-bit processor or 16 bits for the 16-bit processor. The program described on the 32-bit processor does not always operate correctly on the 16-bit processor. As another example, the size of data type in Java (registered trade mark) is determined by the language specification. In the case of integral type, for example, the size of byte type, short type, integer type and long type is 8 bits, 16 bits, 32 bits and 64 bits, respectively. Application of the Java program to the 24-bit processor, therefore, may not lead to correct operation.

The valid bit length of a variable is defined as the logic word length and the datapath width of a processor as the physical word length. The valid bit length of a given variable represents the minimum number of bits required for holding the maximum value and the minimum value that the particular variable can assume. In the case where the range of the value of a unsigned variable x is not less than 0 and not more than 2000, for example, the valid bit length of x is 11 bits.

Figure 16:
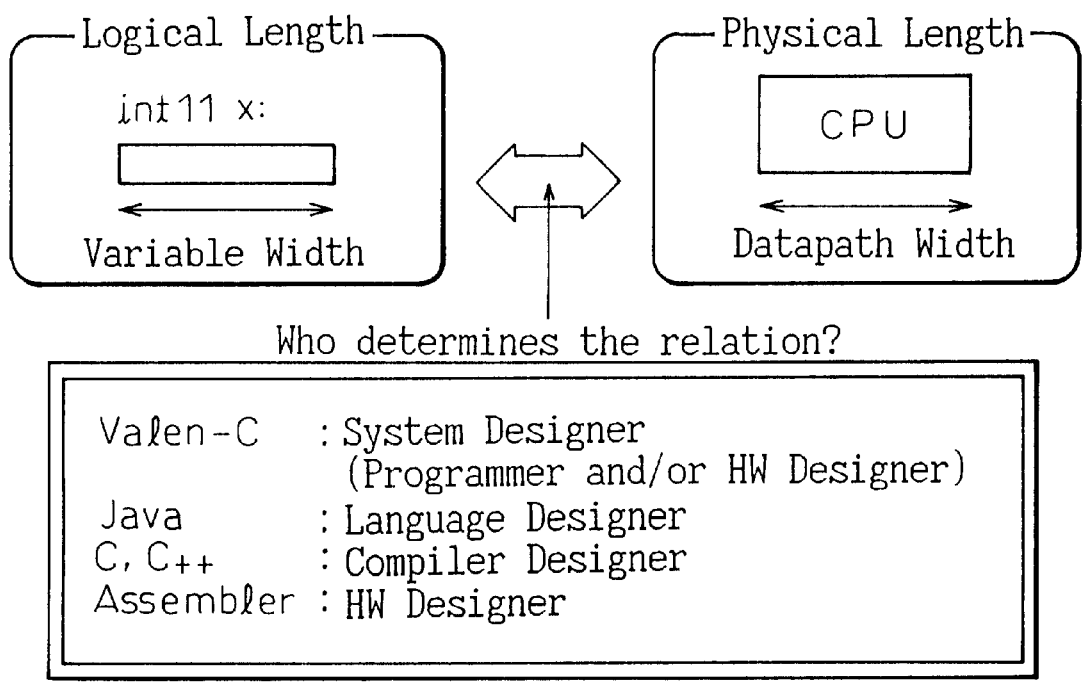
FIG. 16 is a diagram showing the relation between the logic word length and the physical word length in various programming languages.

The logic word length is originally independent of the physical word length. Nevertheless, the two types of word lengths are implicitly related to each other in many programming languages. FIG. 16 is a diagram showing the relation between the logic word length and the physical word length in various programming languages. In C and C++, this relation is determined by the compiler. In Java, the function for the relation is given by the language designer as a language specification. In the assembler, the hardware designer automatically determines the relation. For reusing the software, the logic word length and the physical word length are required to be expressly distinguished from each other.

According to this embodiment, the Valen-C (variable length C) language and the Valen-C compiler are used for improving the software reusability. The Valen-C language is an expansion of the C language for enabling the programmer to expressly designate the accuracy of a variable. In the case where the accuracy required of the variable x is 11 bits, for example, it is declared as int11x. The control structure of the "if" statement and "while" statement is similar to that of the C language. The logic word length and the physical word length are expressly distinguished by the Valen-C language, and the relation therebetween can be determined by the system designer. The result is an improved reusability.

The Valen-C compiler is a retargetable compiler for compiling the program described in Valen-C language for various datapath width. With the machine description supplied by the designer and the Valen-C program as an input, an assembler code of a designated machine is output. The machine description can designate the size of each data type of short, integer, long and longlong. Each variable of the Valen-C program is assigned to any of the data types described above. In other words, the relation between the logic word length and the physical word length is determined by the designer.

An explanation will be given of the process for determining the unrequired part of the chip. First, a given application program A1 is analyzed to determine the number of bits of each variable in the program. Then, the datapath width of the core processor is changed, the program A1 is compiled for each datapath width, and the performance and the power consumption are estimated. From the result of estimation, the datapath width D1 of the core processor minimizing the power consumption within an acceptable performance is calculated. The power consumed by the core processor can be reduced by driving only the datapath width D1 among the datapath width of 64 bits of the core processor.

The unrequired bit lines can be deactivated by driving only the number of bits of the same size as the datapath width D1 among the 64-bit data memory word length. Once the datapath width D1 of the core processor is determined, the number of words of the data memory can also be calculated. As a result, the unrequired word lines of the data memory are deactivated.

The unrequited bits of the instruction memory are calculated in the following manner, for example. The application program A1 is compiled for the core processor for driving only the datapath width D1 thereby to obtain an object code A2. From this object code A2, the number of instruction words required of the instruction memory can be determined. As a result, the unrequired word lines of the instruction memory are deactivated.

The instruction format of the core processor is determined by analyzing the object code A2. For example, the minimum immediate field capable of storing the immediate maximum and minimum values appearing in the object code A2 is prepared as an instruction format. Among the instruction formats determined in this way, an instruction format having the largest number of bits is specified. In the instruction memory, the power consumption is reduced by driving only the number of bits of the instruction formats having the largest number of bits.

In the case where the instruction format changes with each application program, the instruction decoder of the core processor is required to be designed in a programmable manner. The decoder portion of the core processor is realized by a gate array, for example.

In a compiler of an application program, consider the case in which the application program A1 is compiled for the core processor having the datapath width D1.

A compiler B1 is generated based on the information of the datapath width D1 and the compiler-compiler designed in advance.

By compiling the application program A1 by the compiler B1, an object code is obtained which operates on the core processor having the datapath width of D1.

In the case where the datapath width of the core processor is set to the datapath width D2 having a size different from that of the datapath width D1, a compiler B2 is generated based on the compiler-compiler and the information of the datapath width D2. The application program A1 is compiled by the compiler B2 without being changed, thereby producing an object code operating on the core processor having the datapath width D2.

Now, an explanation will be given of the effect that the datapath width, constituting one of the design parameters of the LSI according to the invention, has on the performance and the power consumption of the system.

The maximum one of the valid bit length of the variable in the program is called SPP (single precision point). By reducing the datapath width to SPP, the power consumption of the system can be reduced without adversely affecting the performance. In the case where the datapath width is reduced below SPP, the execution cycles of the program are increased. This is because the variable having the size of SPP is processed as a data of 2 or more words and therefore the number of instructions increases.

In the case where the datapath width is smaller than SPP, the power consumption may decrease. This is because the reduction in the datapath width decreases the word length of the data memory, so that the number of the buses driven between the processor and the data memory, the sense amplifiers driven on the data memory and the bit lines is reduced. These effects, however, depend to a large measure on the memory structure used. The heat generation of the chip increases in proportion to the power consumption, and therefore the power consumption has a direct effect on the package cost and hence on the system price.

The overall energy consumption determining the battery life is related to the drive time of the LSI. As described above, with the reduction in the datapath width, the number of execution cycles increases. As a result, the drive time of the processor and the memory lengthens, thereby often increasing the energy consumption.

As described above, it is difficult to statically determine the datapath width most suitable for a given application. According to this embodiment, the datapath width most suitable for a given application is determined dynamically. For the general-purpose LSI chip described above, an application program is described in the Valen-C language and compiled with the Valen-C compiler for simulation. Thus, the performance, power consumption and energy consumption can be accurately estimated.

Figure 17A:
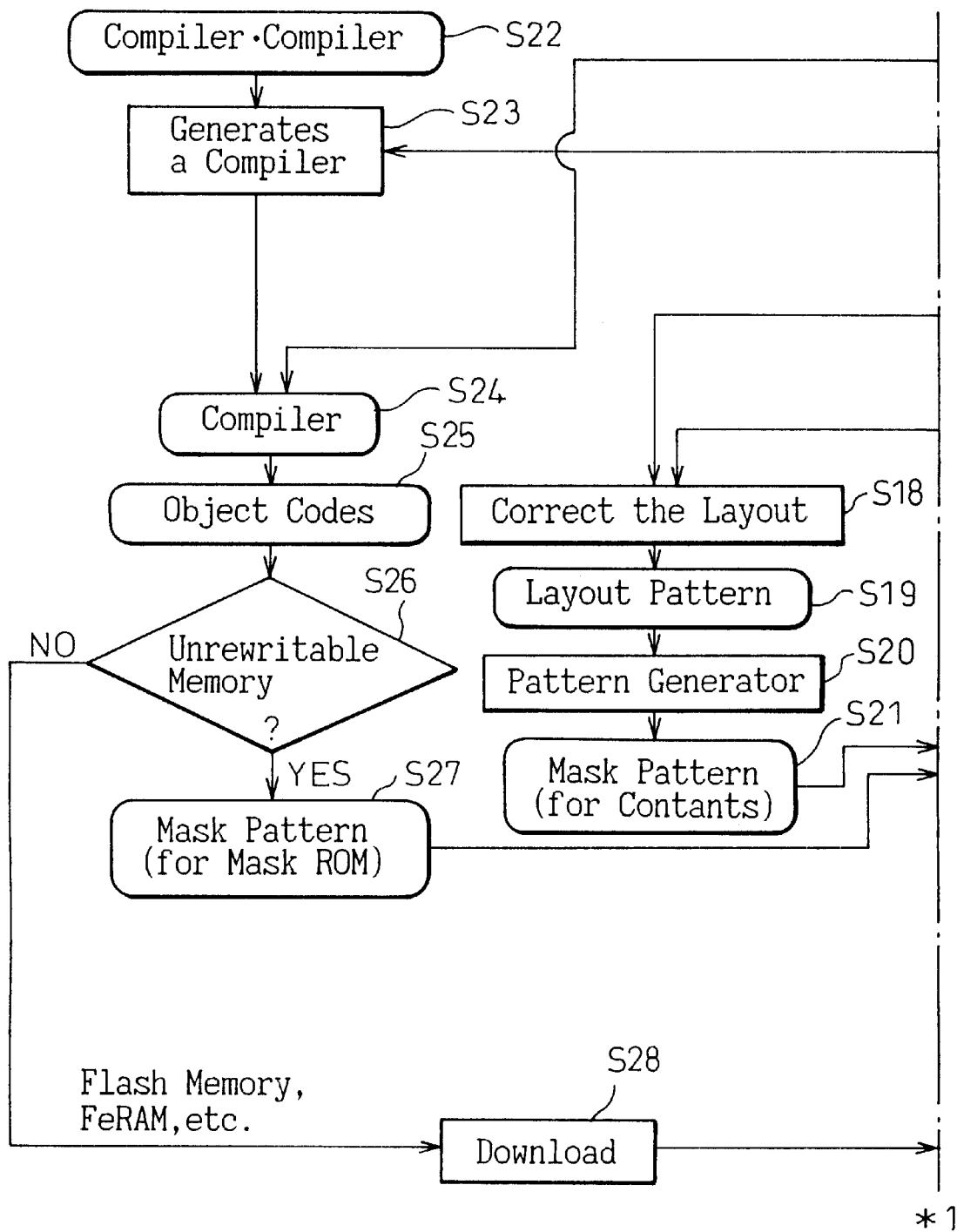
FIGS. 17A and 17B show a flowchart showing, in detail, the manufacturing process according to an embodiment.
Figure 17B:
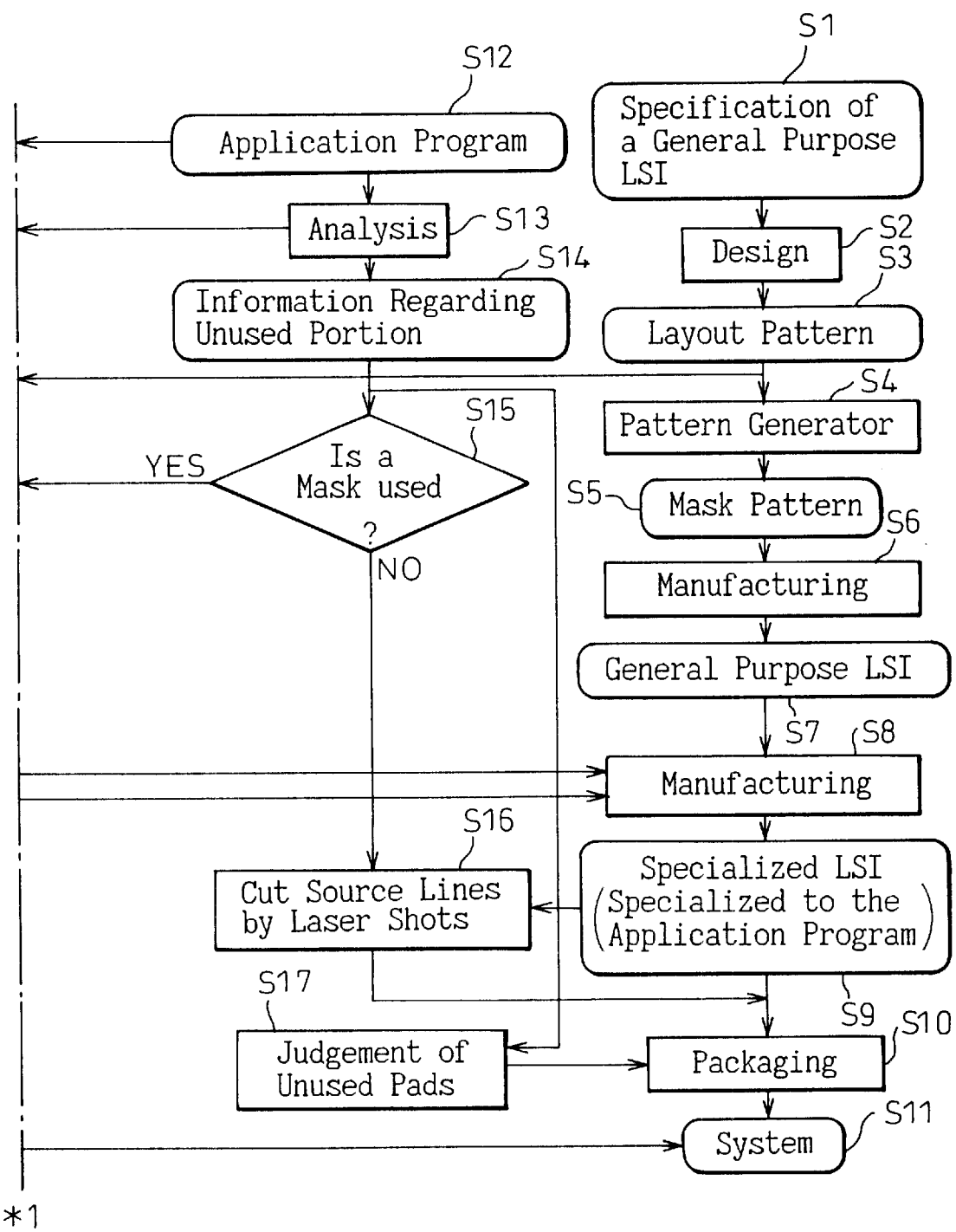

The foregoing description concerns the hardware and the design process according to an embodiment of the invention. The manufacturing process according to this embodiment is summarized in the flowchart of FIGS. 17A and 17B. With reference to this flowchart, the manufacturing process will be described further.

First, in steps S1 to S7, a system LSI chip having the general-purpose functions passed through the manufacturing processes up to just before the last step is produced. This part of the process is the same as the manufacturing process of a normal LSI and therefore will not be described. Apart from this, the compiler-compiler of the system LSI is designed in step S22. In step S12, an application program is described in the Valen-C language in accordance with the specification of the system LSI to be designed thereby to produce the valen-C program. In step S13, this Valen-C program is analyzed and datapath width of the core processor is determined. Further, the word length of the data memory and the instruction memory and the address space are determined. As a result, a configuration of the system LSI (hereinafter called C1) specialized for the application program is determined. This portion corresponds to the design process described with reference to FIG. 15.

The information on the unrequired portion is determined based on the result of analysis in step S13. In step S15, in order to stop power supply to the unrequired portion, it is determined which is to be used, the mask or the laser.

In the case where the mask is used, a layout pattern without the unrequired contacts is generated on the layout pattern of S3 in step S18 based on the information on the unrequired portion of step S14. Based on the layout pattern of step S19, the pattern generator of step S20 generates a mask pattern S21 for generating contacts. In step S8, this mask pattern, together with the ROM mask pattern described later, is applied to the general-purpose LSI of step S7. As a result, the LSI of step S9 specialized for the application program is obtained.

In the case where the laser is used for cutting-off, the points where the power wiring of the system LSI is to be cut off are specified on the system LSI applied through the step S9 based on the information of the unrequired areas of step S14. The particular points are cut off by a laser in step S16.

In step S17, based on the information on the unrequired areas obtained in step S14 and the layout pattern of step S7, the information on the pads required to be connected to external pins are extracted, and only the required pads are bonded in the packaging step of S10.

Further, concurrently with the aforementioned process, a compiler is generated in step S23 for outputting an object code of the specialized LSI in response to the information of the configuration C1 and the compiler-compiler as an input, thus completing the compiler of step S24. In step S25, an application program is input to this compiler thereby to obtain an object code of the LSI having the configuration C1. In step S26, it is determined whether the instruction memory is a non-rewritable memory or not. If it is a non-rewritable memory, a mask pattern for storing the object code in the instruction memory is generated in step S27. In step S8, this mask pattern is applied to the general-purpose LSI of step S7 together with the mask pattern of step S21, thus producing a specialized LSI having the configuration C1 storing the application program in the instruction memory.

In the case of a rewritable memory, on the other hand, a specialized LSI having the configuration C1 is packaged in step S10, after which the object code is downloaded in the rewritable ROM in step S28.

In the case where the configuration C1 changes against the application program, a compiler for the specialized LSI having the configuration C2 can be produced from the information of the new configuration C2 and the compiler-compiler without redesigning the compiler-compiler.

In this way, steps S1 to S7 are shared, and the process of steps S8 to S11, S12 to S21 and S23 to S28 is executed for each application program.

An embodiment of the invention has been explained above. In respect to this, a simulation test was conducted for estimating the performance and the energy consumption while changing the datapath width variously for three application programs according to the invention. The result of the test will be explained below.

In this test, energy consumption as well as power consumption is used as an indicator. The average power consumption is obtained by calculating the energy consumption per unit time.

The performance is approximated by the number of execution cycles. The number of execution cycles is calculated by the execution traces of the basic block and the number of cycles of each basic block.

In calculating the number of data memories required for execution, the size of the stack is required to be estimated if the application program has auto variables. In this test, the maximum value of the stack area with respect to the mass of the input data is assumed to be the size of the stack.

The following three application programs were used for the test. The first is a program for a desk-top calculator, having about 400 lines described in Valen-C. It has an input/output of 12 digits, and the calculations are carried out according the four rules of arithmetic. The distribution of the valid bit length of the variables is shown in Table 1.

TABLE 1

Distribution of variable lengths (desk-top calculator)

| Number of bits      | 4   | 8   | 14 | 39  |
|---------------------|-----|-----|----|-----|
| Number of variables | 257 | 257 | 3  | 258 |

The second is the Lempel-Ziv algorithm widely used for a printer and a hard disk for coding/decoding the character strings. The program is described in about 300 lines of Valen-C language. The distribution of the valid bit length of variables is shown in Table 2.

TABLE 2

Distribution of variable lengths (Lempel-Ziv)

| Number of bits      | 1 | 4 | 5 | 8      | 13 | 15 |
|---------------------|---|---|---|--------|----|----|
| Number of variables | 1 | 1 | 2 | 20,481 | 3  | 6  |

The third is ADPCM constituting one of the DSPstone bench marks. This test uses only the encoded portion in which the 16-bit linear audio data is compressed to 4 bits. This program is about 530 lines in Valen-C language. The distribution of valid bit lengths of variables is shown in Table 3.

TABLE 3

Distribution of variable lengths (adpcm)

| Number of bits      | 1  | 3  | 4  | 5  | 9  | 10 | 11 | 12     |
|---------------------|----|----|----|----|----|----|----|--------|
| Number of variables | 7  | 1  | 7  | 1  | 1  | 7  | 9  | 33     |
| Number of bits      | 13 | 14 | 15 | 16 | 17 | 19 |    | †$D_w$ |
| Number of variables | 4  | 14 | 24 | 7  | 1  | 1  |    | 8      |

†$D_w$: Pointer variable

For simplicity's sake, the approximation model explained below is used as a model of energy consumption.

The switched capacitance (called SC) of the CMOS circuit is expressed by equation (6) below.

$$SC = \sum_{k=1}^{n} C(k) \times Swit(k) \tag{6}$$

where n is the number of gates of the CMOS circuit, and C(k) the average number of switching operations of the gate. Let Vdd the source voltage of the processor, f the operating frequency of the processor, and Cycle the number of execution cycles. The energy consumption of the processor is given by equation (7) below.

$$E_{processor} = SC \times \frac{Cycle}{f} \times V_{dd}^2 \tag{7}$$

In this test, the RISC processor Bung-DLX of sequential execution type having an instruction set of DLX architecture was used as a processor. Bung-DLX is a processor in which the datapath width and the number of registers can be changed freely. The datapath width of Bung-DLX and the word length of the data memory are assumed to be equal to each other. It is also assumed that the instruction word length is 32 bits, the number of instructions 107, and the number of registers 32.

The SC of Bung-DLX of 32 bits is determined from equation (6). Swit(k) is determined by the gate level simulation, and C(k) by the layout synthesis. In this test, SC is assumed to be proportional to the number of gates of Bung-DLX unless the datapath width is 32 bits. In other words, the following equation (8) holds.

$$SC(b) = \frac{SC(32)}{32} \times b \tag{8}$$

where b is the datapath width and SC(b) is SC for the datapath width of b.

The SRAM is assumed to be used as a data memory, and the ROM as an instruction memory. The energy consumption of the data memory and the instruction memory are estimated by equations (9) and (10) below.

$$E_{data} = e_j \times N_j \tag{9}$$

$$E_{instructions} = e_j \times N_j \tag{10}$$

where $e_j$ is the energy consumed per access by the memory j, e.g., SRAM or ROM; and $N_j$ the number of times accessed to memory j (SRAM or ROM). The value $e_j$ depends on the structure and size of the memory j. The value of $N_j$ corresponds to the number of load/store instructions executed and the number of executed instructions, e.g., SRAM or ROM. The value of $N_j$ can be calculated from the assembler code and the trace information of the basic block.

As described above, the change in the datapath width of the processor changes the word length of the data memory (=datapath width) and the number of words. The value $e_{SRAM}$ having the memory word length of b and the number w of words is determined by the approximation equation (11) below.

$$e_{SRAM}(b, w) = \frac{e_{SRAM}(16, 128)}{16 \times 128} \times b \times w \tag{11}$$

Equation (11) is based on the value of the energy consumption (J) required for each read operation as determined by the SPICE simulation using the SRAM of 2 K bits (16 bits×128 words). Also, the following equation (12) is assumed to hold.

$$e_{ROM}(32, w) = e_{SRAM}(32, w) \tag{12}$$

where it should be noted that the instruction word length is fixed to 32 bits. Also, the energy consumption required for writing into the memory is assumed to be equal to the energy consumption required for reading from it.

Figure 18:
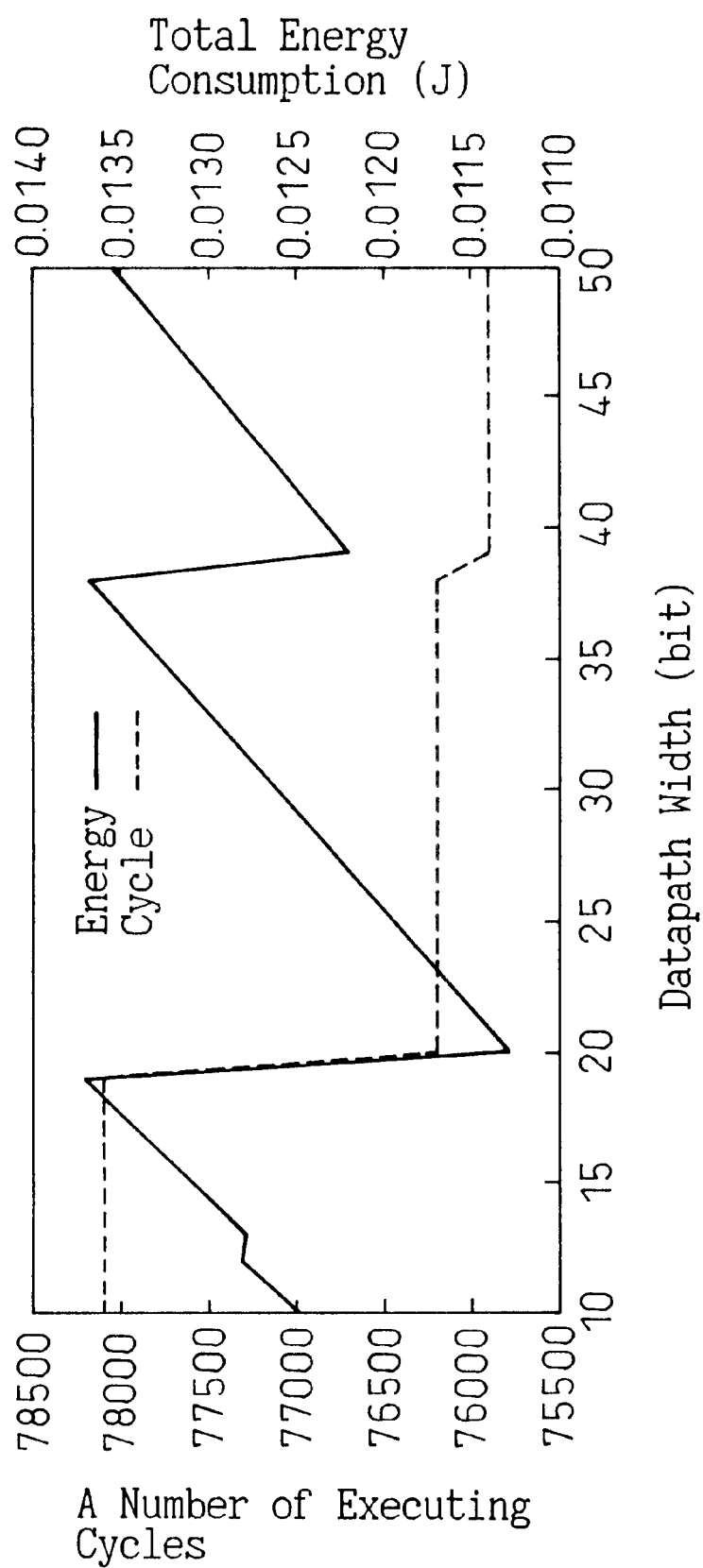
FIG. 18 is a diagram showing the result of an experiment conducted on an application of a desk-top calculator according to the invention.

The test result is shown in FIGS. 18 to 20. In the desk-top calculator of FIG. 18, the energy consumption of the system as a whole is minimum when the datapath width is 20 bits. This is the reduction of energy consumption by about 12% as compared with the datapath width of 32 bits. In the process, the number of execution cycles remains unchanged. The reduction in the datapath width from 20 bits to 19 bits increases the number of execution cycles. The reason is that many instructions are required for loading/storing the 39-bit variables. In the case of a 19-bit Bung-DLX, for example, three load instructions are required for loading 39-bit data.

In the case of Lempel-Ziv of FIG. 19, the energy consumption is minimum when the datapath width is 8 bits. As compared with the 32-bit processor, the energy consumption is reduced by about 51%. In Lempel-Ziv, the effect of the consumed energy reduction attributable to the unrequired bits of the data memory is conspicuous. Assuming that the datapath width is reduced from 32 bits to 8 bits, the data memory is reduced by about 75% in terms of the number of bits, so that the energy consumption in the data memory is reduced by 63%. Nevertheless, the number of execution cycles increases by about 30%.

In the ADPCM of FIG. 20, the energy consumption is minimum when the datapath width is 19 bits. As compared with the 32-bit processor, the energy consumption is about 7% lower. For the datapath width of 19 bits or more, on the other hand, the number of execution cycles remains unchanged. When the datapath width is smaller than 15 bits, both the performance and the energy consumption are drastically increased by reason of the fact that the 15-bit shift operation represents a considerable proportion of all the arithmetic operations executed. In these shift operations, the datapath width of 15 bits or less is accompanied by a multiple-precision shift instruction. In Bung-DLX, the multiple-precision shift instruction cannot be executed in one instruction, and therefore the particular instruction is converted into a loop statement of one bit shift by the Valen-C compiler. For this reason, both the number of bits of the ROM and the number of times the ROM is accessed are considered to have remarkably increased. In the case where the datapath width is reduced from 15 bits to 8 bits, on the other hand, the number of bits of the ROM increases about 1.9 times and the number of execution cycles increases about 1.7 times.

Figure 21A:
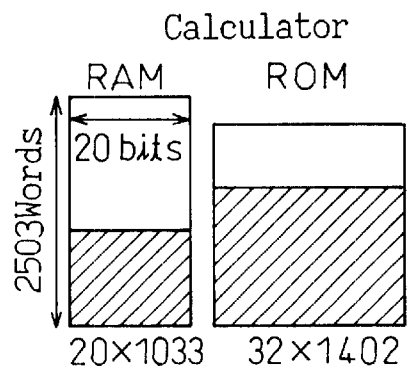
FIGS. 21A to 21C are diagrams showing the working area of a memory used in the experiments conducted on the three applications.
Figure 21B:
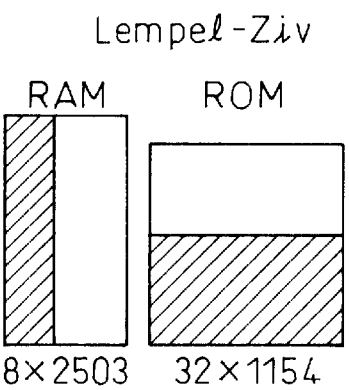
Figure 21C:
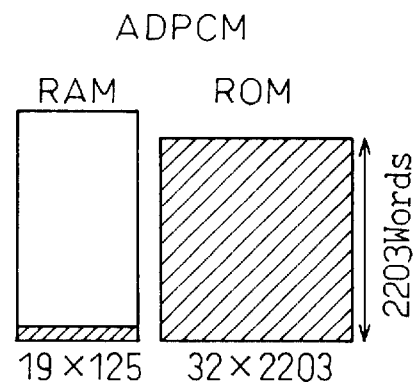

Now, an example to minimize the energy consumption of a single general-purpose LSI. chip in which the above-mentioned three applications are realized will be described. This general-purpose LSI chip requires a SRAM of 20 bits×2503 words and a ROM of 32 bits×2203 words. The manner in which the memory is used in these applications is shown in FIGS. 21A to 21C. FIG. 21A represents the case of desk-top calculator, FIG. 21B the case of Lempel-Ziv, and FIG. 21C the case of ADPCM. The numerals described under each memory indicates the working area. The datapath width of the processor with the desk-top calculator, Lempel-Ziv and ADPCM packaged thereon is 20 bits, 8 bits and 19 bits, respectively. As seen from the diagrams, the unused memory area is very large depending on applications. In the SRAM for ADPCM, for example, about 95% of the area is not used. This indicates the effectiveness of the mechanism of stopping the power supply or the clock supply to the bits not required.

It will thus be understood from the foregoing description that according to the present invention, there is realized a method of manufacturing a flexible system LSI chip capable of reducing both the cost and power consumption of the system LSI at the same time. By reusing the LSI chip integrated with the systems, mass production is made possible for a reduced chip unit price. Further, the LSI chip according to the invention, which includes a mechanism for stopping unrequired power or clock supply in bits, wasteful power consumption is eliminated. The power and clock to be supplied is designated by the designer immediately before packaging.

Also, the flexibility of the method of manufacturing the flexible system LSI chip deteriorates the software reusability. In spite of, this, according to this invention employing the C language expanded to expressly designate the number of bits of the variable as a new software description language, the software reusability can be secured. Application of this invention improves both the hardware reusability and software reusability thus remarkably improving the efficiency of the system design.

What is claimed is:

1. A method of manufacturing a system LSI having at least a processor and a memory in a single chip, comprising:
   providing an LSI general-purpose base chip;
   determining a working area for activation of an application program mounted on said system LSI based on a datapath width of said processor and a word length and a number of words of said memory used for activating said application program; and
   completing manufacture of said system LSI in such a manner as not to supply power to an unused area other than said working area.

2. A method of manufacturing a system LSI according to claim 1,
   wherein an electrode pad of said unused area is not connected to an external pin when packaging said system LSI.

3. A method of manufacturing a system LSI according to claim 1,
   wherein said application program is described in a software language capable of being utilized to arbitrarily set said datapath width.

4. A method of manufacturing a system LSI according to claim 3,
   wherein said determining the working area includes compiling said application program using a compiler in accordance with said set datapath width and simulating said compiled application program.

5. A method of manufacturing a system LSI according to claim 1,
   wherein said determining the working area for activating said application program includes setting the most significant bits of said processor and said memory as an unused area.

6. A method of manufacturing a system LSI according to claim 1,
   wherein said determining the working area for activating said application program includes setting the least significant bits of said processor and said memory as an unused area.

7. A system LSI manufactured with the method of claim 1.

8. A system LSI comprising at least a processor, a memory, and a power wiring for supplying power only to a working area of said processor and said memory, upon activation of an application program mounted on said system LSI, said working area being determined by a datapath width of said processor and a word length and a number of words of said memory used for activating said application program; wherein a predetermined bit of said datapath width is set as an unused area and power being supplied to said working area and not said unused.

9. A system LSI according to claim 8,
   wherein an electrode pad of said unused area is not connected to an external pin when packaging said system LSI.

10. A system LSI according to claim 8,
    wherein the predetermined bit of the datapath width of said processor is the most significant bit.

11. A system LSI according to claim 10,
    wherein said processor includes a selector for selectively outputting an arbitrary carry bit of an arithmetic logic unit.

12. A system LSI according to claim 10,
wherein said processor includes a clock supply control circuit for controlling, collectively in bits, a clock signal input to a flip-flop.

13. A system LSI according to claim 8,
wherein the predetermined bit of the datapath width of said processor is the least significant bit.

14. A system LSI according to claim 13,
wherein said processor includes a selector for inputting a selected carry bit input from an external source and a carry bit output of the least significant bits to an arithmetic logic unit.

15. A system LSI according to claim 13,
wherein said processor includes a clock supply control circuit for controlling, collectively in bits, a clock signal input to a flip-flop.

16. A system LSI according to claim 8,
wherein said processor and said memory are divided into a plurality of large areas each including an upper power wiring layer being capable of supplying power to each of said large areas and a lower power wiring layer being capable of supplying power to smaller areas in each of said large areas;
wherein the wiring of said upper power wiring layer to said large areas is cut off in the case where all of said large areas are included in said unused area; and
wherein the wiring of said upper power wiring layer to said large areas is not cut off and said lower power wiring layer in said large areas is partially cut off in the case where part of said large areas is included in said unused area.

17. A method of utilizing an LSI general-purpose base chip to manufacture a system LSI, the base chip including a processor and a memory, the method comprising the steps of:
determining a working area for activation of an application program mounted on the system LSI based on a datapath width of the processor and a word length and a number of words of the memory used for activating the application program; and,
limiting a supply of power to the working area of the system LSI wherein an unused area of the system LSI is not supplied power.

18. A system LSI manufactured with the method of claim 17.

19. The method of manufacturing a system LSI of claim 17 wherein determining the working area for activating the application program includes setting the most significant bits of the processor and the memory as an unused area.

20. The method of manufacturing a system LSI of claim 17 wherein determining the working area for activating the application program includes setting the least significant bits of the processor and the memory as an unused area.

21. A system LSI comprising at least a processor, a memory, and a power wiring for supplying power only to a working area of said processor and said memory, upon activation of an application program mounted on said system LSI, said working area being determined by a datapath width of said processor and a word length and a number of words of said memory used for activating said application program; wherein power is not supplied to an unused area other than said working area, and further wherein the most significant bits of said processor and said memory are set as an unused area.

22. The system LSI of claim 21 wherein said processor includes a selector for selectively outputting an arbitrary carry bit of an arithmetic logic unit.

23. The system LSI of claim 21 wherein said processor includes a clock supply control circuit for controlling, collectively in bits, a clock signal input to a flip-flop.

24. A system LSI comprising at least a processor, a memory, and a power wiring for supplying power only to a working area of said processor and said memory, upon activation of an application program mounted on said system LSI, said working area being determined by a datapath width of said processor and a word length and a number of words of said memory used for activating said application program; wherein power is not supplied to an unused area other than said working area, and further wherein the least significant bits of said processor and said memory are set as an unused area.

25. The system LSI of to claim 24 wherein said processor includes a selector for inputting a selected carry bit input from an external source and a carry bit output of the least significant bits to an arithmetic logic unit.

26. The system LSI of claim 25 wherein said processor includes a clock supply control circuit for controlling, collectively in bits, a clock signal input to a flip-flop.

27. A method of manufacturing a system LSI having at least a processor and a memory in a single chip, the method comprising:
providing an LSI general-purpose base chip;
determining a working area for activation of an application program mounted on said system LSI based on a datapath width of said processor and a word length and a number of words of said memory used for activating said application program; and,
completing manufacture of said system LSI in such a manner as not to supply power to an unused area other than said working area, wherein determining the working area for activating said application program includes setting the most significant bits of said processor and said memory as an unused area.

28. A method of manufacturing a system LSI having at least a processor and a memory in a single chip, the method comprising:
providing an LSI general-purpose base chip;
determining a working area for activation of an application program mounted on said system LSI based on a datapath width of said processor and a word length and a number of words of said memory used for activating said application program; and,
completing manufacture of said system LSI in such a manner as not to supply power to an unused area other than said working area, wherein determining the working area for activating said application program includes setting the least significant bits of said processor and said memory as an unused area.

* * * * *